United States Patent
Maeta et al.

(10) Patent No.: US 10,090,408 B2
(45) Date of Patent: Oct. 2, 2018

(54) SEMICONDUCTOR DEVICE AND METHOD OF MANUFACTURING SEMICONDUCTOR DEVICE

(71) Applicant: FUJI ELECTRIC CO., LTD., Kawasaki-shi, Kanagawa (JP)

(72) Inventors: Ryo Maeta, Matsumoto (JP); Toshiaki Sakata, Matsumoto (JP); Shunji Takenoiri, Matsumoto (JP)

(73) Assignee: FUJI ELECTRIC CO., LTD., Kawasaki-Shi, Kanagawa (JP)

(*) Notice: Subject to any disclaimer, the term of this patent is extended or adjusted under 35 U.S.C. 154(b) by 0 days.

(21) Appl. No.: 15/666,529

(22) Filed: Aug. 1, 2017

(65) Prior Publication Data

US 2018/0076315 A1    Mar. 15, 2018

(30) Foreign Application Priority Data

Sep. 14, 2016 (JP) ................. 2016-180032

(51) Int. Cl.
*H01L 29/76* (2006.01)
*H01L 29/94* (2006.01)
(Continued)

(52) U.S. Cl.
CPC ...... *H01L 29/7811* (2013.01); *H01L 21/2251* (2013.01); *H01L 21/26513* (2013.01);
(Continued)

(58) Field of Classification Search
None
See application file for complete search history.

(56) References Cited

U.S. PATENT DOCUMENTS 6,551,909 B1   4/2003   Fujihira
2006/0131644 A1   6/2006   Saito et al.
(Continued)

FOREIGN PATENT DOCUMENTS

JP   2000-040822 A   2/2000
JP   2004-072068 A   3/2004
(Continued)

OTHER PUBLICATIONS

Seung-Chul Lee, et al, "Investigation of Gate Oscillation of Power MOSFETs Induced by Avalanche Mode Operation", Proceedings of the 19th International Symposium on Power Semiconductor Devices and IC's, Korea, IEEE, May 27-30, 2007, pp. 113 to 116.

*Primary Examiner* — Thien F Tran
(74) *Attorney, Agent, or Firm* — Rabin & Berdo, P.C.

(57) ABSTRACT

A SJ-MOSFET includes a parallel pn layer in which an n-type drift region and a p-type partition region are alternately arranged repeatedly along a direction parallel to a base main-surface. The n-type drift region and the p-type partition region have total impurity amounts that are roughly the same and widths that are basically constant over an entire depth direction. The n-type drift region is configured to have an n-type impurity concentration profile in which an impurity concentration of a portion on the drain-side is higher than an impurity concentration of a portion on the source-side by $\Delta C_{nx}$. The p-type partition region is configured to have a p-type impurity concentration profile in which an impurity concentration of a portion on the drain-side is higher than an impurity concentration of a portion on the source-side by $\Delta C_{ph}$, and an impurity concentration of part of the portion on the source-side is relatively low.

8 Claims, 17 Drawing Sheets

(51) Int. Cl.
  *H01L 31/062* (2012.01)
  *H01L 31/113* (2006.01)
  *H01L 31/119* (2006.01)
  *H01L 29/78* (2006.01)
  *H01L 29/06* (2006.01)
  *H01L 29/08* (2006.01)
  *H01L 29/36* (2006.01)
  *H01L 29/66* (2006.01)
  *H01L 21/265* (2006.01)
  *H01L 21/225* (2006.01)
  *H01L 21/324* (2006.01)
  *H01L 29/10* (2006.01)
  *H01L 29/739* (2006.01)
  *H01L 29/872* (2006.01)

(52) U.S. Cl.
  CPC ........ *H01L 21/324* (2013.01); *H01L 29/0634* (2013.01); *H01L 29/0688* (2013.01); *H01L 29/0865* (2013.01); *H01L 29/0882* (2013.01); *H01L 29/1095* (2013.01); *H01L 29/36* (2013.01); *H01L 29/66712* (2013.01); *H01L 29/66143* (2013.01); *H01L 29/66333* (2013.01); *H01L 29/7395* (2013.01); *H01L 29/872* (2013.01)

(56) References Cited

U.S. PATENT DOCUMENTS

| | | |
|---|---|---|
| 2008/0246079 A1 | 10/2008 | Saito et al. |
| 2009/0273031 A1 | 11/2009 | Saito et al. |
| 2015/0303294 A1* | 10/2015 | Sakata ................ H01L 29/4238 257/330 |

FOREIGN PATENT DOCUMENTS

| | | |
|---|---|---|
| JP | 2006-179598 A | 7/2006 |
| JP | 2009-272397 A | 11/2009 |
| JP | 4564509 B2 | 10/2010 |
| JP | 4768259 B2 | 9/2011 |

* cited by examiner

BREAKDOWN VOLTAGE: AT SAME TIME

ON RESISTANCE: AT SAME TIME

SEMICONDUCTOR DEVICE AND METHOD OF MANUFACTURING SEMICONDUCTOR DEVICE

CROSS REFERENCE TO RELATED APPLICATIONS

This application is based upon and claims the benefit of priority of the prior Japanese Patent Application No. 2016-180032, filed on Sep. 14, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Ordinarily, in n-channel type vertical metal oxide semiconductor effect transistors (MOSFETs), among semiconductor layers provided within a semiconductor substrate, an $n^-$-type drift layer is a region having the highest electrical resistance. The electrical resistance of the $n^-$-type drift layer greatly affects the overall ON-state resistance of the vertical MOSFET. Reduction of the overall ON-state resistance of the vertical MOSFET may be achieved by reducing the thickness of the $n^-$-type drift layer and shortening the current path of the main current.

Nonetheless, in a MOSFET, in the OFF state, the breakdown voltage is sustained by the spreading of a depletion layer from a pn junction between a p-type base region and the $n^-$-type drift layer to the $n^-$-type drift layer. The breakdown voltage is the voltage limit at which element destruction does not occur. When the thickness of the $n^-$-type drift layer is reduced to reduce the ON-state resistance, the spread of the depletion layer in the OFF state becomes shorter whereby the critical electric field strength is easily reached by a low voltage between the drain and source, lowering the breakdown voltage. Meanwhile, although higher breakdown voltages are possible the longer the spread of the depletion layer is in the OFF state, the thickness of the $n^-$-type drift layer has to be increased, resulting in increased ON-state resistance.

With such a tradeoff between reducing ON-state resistance and improving breakdown voltage, it is generally difficult to achieve both currently. This tradeoff relationship is known to exist in other semiconductor devices such as insulated gate bipolar transistors (IGBTs), bipolar transistors, diodes, and the like. A superjunction (SJ) structure in which a drift layer is provided as a parallel pn layer of an n-type region (hereinafter, n-type drift region) having an increased impurity concentration and a p-type region (hereinafter, p-type partition region) alternately arranged has been proposed as an element structure that improves this tradeoff (for example, refer to Japanese Laid-Open Patent Publication No. 2000-040822).

In the SJ structure, by making the impurity concentrations of the n-type drift region and the p-type partition region of the parallel pn layer equal, a pseudo non-doped layer is formed in the drift layer by the depletion layer spreading from the pn junction between the n-type drift region and the p-type partition region in the OFF state, enabling the resistance of the drift layer to be increased. In addition, in the ON state, since the main current flows between the drain and source, via the n-type drift region having an increased impurity concentration, the ON-state resistance may also be reduced. Further, by providing an $n^-$-type buffer layer between the parallel pn layer and an $n^+$-type drain layer, the ON-state resistance is further reduced and the tradeoff relationship with the breakdown voltage may be enhanced as compared to a case in which the $n^-$-type buffer layer is not provided.

On the other hand, in a semiconductor device having a conventional SJ structure (hereinafter, SJ semiconductor device), when the charge balance of the n-type drift region and the p-type partition region of the parallel pn layer is set under a condition that the breakdown voltage becomes highest, and the current between the drain and source when avalanche breakdown occurs (hereinafter, avalanche current) rapidly increases, the drain voltage decreases. This condition is when the total impurity amount of the n-type drift region and the p-type partition region of the parallel pn layer are set to be roughly the same and in the respective regions, the impurity concentration in a depth direction are set to be roughly uniform. Therefore, local concentration of the avalanche current is facilitated, arising in a problem of decreased breakdown tolerance (hereinafter, avalanche tolerance).

A device has been proposed as a SJ semiconductor device to solve this problem. The device has a parallel pn layer in which, on the substrate front surface side, the impurity concentration of the p-type partition region is made to be higher than the impurity concentration of the adjacent n-type drift region, and on the substrate rear surface side, the impurity concentration of the p-type partition region is made to be lower than the impurity concentration of the adjacent n-type drift region (for example, refer to Japanese Laid-Open Patent Publication No. 2004-072068 (paragraph 0020, FIG. 1)). In Japanese Laid-Open Patent Publication No. 2004-072068, when avalanche breakdown occurs, negative resistance at a predetermined bias point in current-voltage characteristics is reduced, enhancing avalanche tolerance.

Further, a device has been proposed as another SJ semiconductor device. The proposed device includes a parallel pn layer in which the impurity amounts of the n-type drift region and the p-type partition region are equal and have the same distribution. Additionally, the sum of the impurity amounts of the n-type drift region and the p-type partition region is highest at a center in the depth direction of the regions and decreases with proximity to the substrate front surface side and the substrate rear surface side (for example, refer to Japanese Patent No. 4564509 (paragraph 0018, FIG. 1)). In Japanese Patent No. 4564509, electric field strength distribution is greatest at a center in the depth direction of the parallel pn layer and decreases with proximity to the substrate front surface side and the substrate rear surface side whereby the occurrence of negative resistance when avalanche breakdown occurs is suppressed, enhancing avalanche tolerance.

Further, a device has been proposed as another SJ semiconductor device. The device includes a parallel pn layer in which the impurity concentration of the n-type drift region in the depth direction is uniform, and on the substrate rear surface side, the impurity concentration of the p-type partition region is higher than the impurity concentration of the adjacent n-type drift region (for example, refer to Japanese Patent No. 4768259 (paragraph 0024, FIG. 1), Japanese Laid-Open Patent Publication No. 2009-272397 (paragraph 0022, FIG. 1), and Japanese Laid-Open Patent Publication No. 2006-179598 (paragraph 0024, FIG. 1)). In Japanese Patent No. 4768259 and Japanese Laid-Open Patent Publication No. 2009-272397, electric field is caused to concentrate at a portion of the p-type partition region on the substrate rear surface side and the local concentration site of avalanche current is fixed to be a portion of the p-type partition region on the substrate rear surface side whereby turning ON of a parasitic npn bipolar transistor is suppressed, enhancing avalanche tolerance.

SUMMARY OF THE INVENTION

According to one aspect of the present invention, a semiconductor device includes a parallel pn layer in which a first-conductivity-type semiconductor region and a second-conductivity-type semiconductor region are alternately arranged on a semiconductor layer of a first conductivity type, repeatedly along a direction parallel to a surface of the semiconductor layer; an element structure provided on a side of the parallel pn layer opposite the semiconductor layer; a first electrode electrically connected to a semiconductor area constituting the element structure; and a second electrode electrically connected to the semiconductor layer. The first-conductivity-type semiconductor region has a width that is constant in a depth direction. The second-conductivity-type semiconductor region has a width that is constant in the depth direction. The first-conductivity-type semiconductor region has an impurity concentration profile in which an impurity concentration of a first portion of the first-conductivity-type semiconductor region toward the second electrode is made higher than an impurity concentration of a second portion of the first-conductivity-type semiconductor region toward the first electrode. The second-conductivity-type semiconductor region has an impurity concentration profile in which an impurity concentration of a portion of the second-conductivity-type semiconductor region toward the second electrode is made higher than an impurity concentration of a portion of the second-conductivity-type semiconductor region toward the first electrode, and an impurity concentration of part of the portion of the second-conductivity-type semiconductor region toward the first electrode is made relatively lower than that of other parts of the portion of the second-conductivity-type semiconductor region toward the first electrode. The impurity concentration of the portion of the second-conductivity-type semiconductor region toward the second electrode is made higher than the impurity concentration of the portion of the first-conductivity-type semiconductor region toward the second electrode.

In the semiconductor device, the first-conductivity-type semiconductor region and the second-conductivity-type semiconductor region have a same total impurity amount.

In the semiconductor device, the impurity concentration of the portion of the second-conductivity-type semiconductor region toward the first electrode is a same impurity concentration as the impurity concentration of the portion of first-conductivity-type semiconductor region toward the first electrode.

In the semiconductor device, the impurity concentration of the portion of the first-conductivity-type semiconductor region toward the second electrode increases toward the second electrode according to a predetermined ratio.

In the semiconductor device, the impurity concentration of the portion of the second-conductivity-type semiconductor region toward the second electrode increases toward the second electrode according to a predetermined ratio.

In the semiconductor device, a low-concentration of the portion of the second-conductivity-type semiconductor region toward the first electrode has an impurity concentration that is relatively low and that is lowest near a center in a depth direction of the low-concentration.

In the semiconductor device, the element structure includes a first semiconductor region of a second conductivity and constituting a portion of the semiconductor area, the first semiconductor region being formed in a surface layer on a side of the second-conductivity-type semiconductor region opposite the semiconductor layer, so as to be in contact with the first-conductivity-type semiconductor region; a second semiconductor region of the first conductivity type and constituting another portion of the semiconductor area, the second semiconductor region being selectively formed in the first semiconductor region; a gate insulating film formed so as to be in contact with a region of the first semiconductor region between the first-conductivity-type semiconductor region and the second semiconductor region; and a gate electrode formed on an opposite side of the first semiconductor region, sandwiching the gate insulating film in between the gate electrode and the first semiconductor region.

The semiconductor device includes a first-conductivity-type low-concentration semiconductor layer having an impurity concentration lower than an impurity concentration of the first-conductivity-type semiconductor region, formed between the semiconductor layer and the parallel pn layer.

According to another aspect of the invention, a method manufactures a semiconductor device including a parallel pn layer in which a first-conductivity-type semiconductor region and a second-conductivity-type semiconductor region are alternately arranged on a semiconductor layer of a first conductivity type, repeatedly along a direction parallel to a surface of the semiconductor layer, where the first-conductivity-type semiconductor region has an impurity concentration profile in which an impurity concentration of a portion of the first-conductivity-type semiconductor region toward the semiconductor layer is made higher than an impurity concentration of a portion of the first-conductivity-type semiconductor region toward a side opposite from the semiconductor layer; the second-conductivity-type semiconductor region has an impurity concentration profile in which an impurity concentration of a portion of the second-conductivity-type semiconductor region toward the semiconductor layer is made higher than an impurity concentration of a portion of the second-conductivity-type semiconductor region toward a side opposite from the semiconductor layer, and an impurity concentration of part of the portion of the second-conductivity-type semiconductor region toward the side opposite from the semiconductor layer is made relatively lower than that of other parts of the portion of the second-conductivity-type semiconductor region toward the side opposite from the semiconductor layer; and the impurity concentration of the portion of the second-conductivity-type semiconductor region toward the semiconductor layer is higher than the impurity concentration of the portion of the first-conductivity-type semiconductor region toward the semiconductor layer. The method includes repeatedly performing as one set, depositing an epitaxial layer of a first conductivity type on the semiconductor layer, first ion implanting of a first-conductivity-type impurity in a formation region of the first-conductivity-type semiconductor region on a surface of the epitaxial layer, and second ion implanting of a second-conductivity-type impurity in a formation region of the second-conductivity-type semiconductor region on the surface of the epitaxial layer. In a first session of the first ion implanting, the first ion implanting is performed a plurality of times at differing accelerating voltages. In second and subsequent sessions of the first ion implanting, the first ion implanting is performed fewer times than in the first session. In a first session of the second ion implanting, the second ion implanting is performed more times than the first ion implanting in the first session thereof, at respectively differing accelerating voltages and at a dose amount that is a same dose amount as that of the first ion implanting. In second and subsequent sessions of the second ion implanting, the second ion implanting is performed fewer times than in the first session thereof, at a dose amount that is a same dose amount as that of the first ion implanting. By the second and subsequent sessions of the second ion implanting of the one set repeatedly performed, a dosed amount is less than a dosed amount by the first session of the second ion implanting.

The method further includes depositing on the epitaxial layer in which the formation region of the first-conductivity-type semiconductor region and the formation region of the second-conductivity-type semiconductor region are ion implanted, a second epitaxial layer of the first conductivity type, after the one set is performed; and diffusing the first-conductivity-type impurity and the second-conductivity-type impurity by heat treating after depositing the second epitaxial layer. The heat treating includes diffusing the first-conductivity-type impurity and forming the first-conductivity-type semiconductor region to be continuous between the epitaxial layer to the second epitaxial layer, and diffusing the second-conductivity-type impurity and forming the second-conductivity-type semiconductor region to be continuous between the epitaxial layer and the second epitaxial layer.

The method still further includes forming a first-conductivity-type low-concentration semiconductor layer having an impurity concentration lower than that of the first-conductivity-type semiconductor region, on the semiconductor layer before a first session of depositing the epitaxial layer on the semiconductor layer. In the first session of depositing the epitaxial layer, the epitaxial layer is deposited on the first-conductivity-type low-concentration semiconductor layer.

Objects, features, and advantages of the present invention are specifically set forth in or will become apparent from the following detailed description of the invention when read in conjunction with the accompanying drawings.

DETAILED DESCRIPTION OF THE INVENTION

Figure 1A:
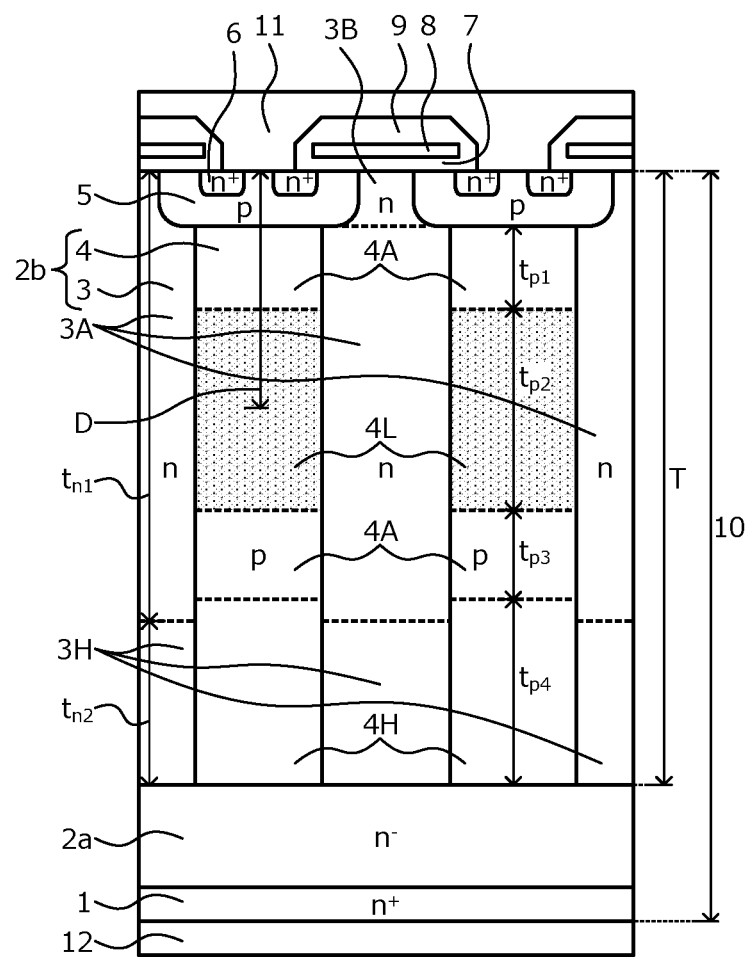
FIGS. 1A, 1B, and 1C are diagrams of constituent regions of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1B:
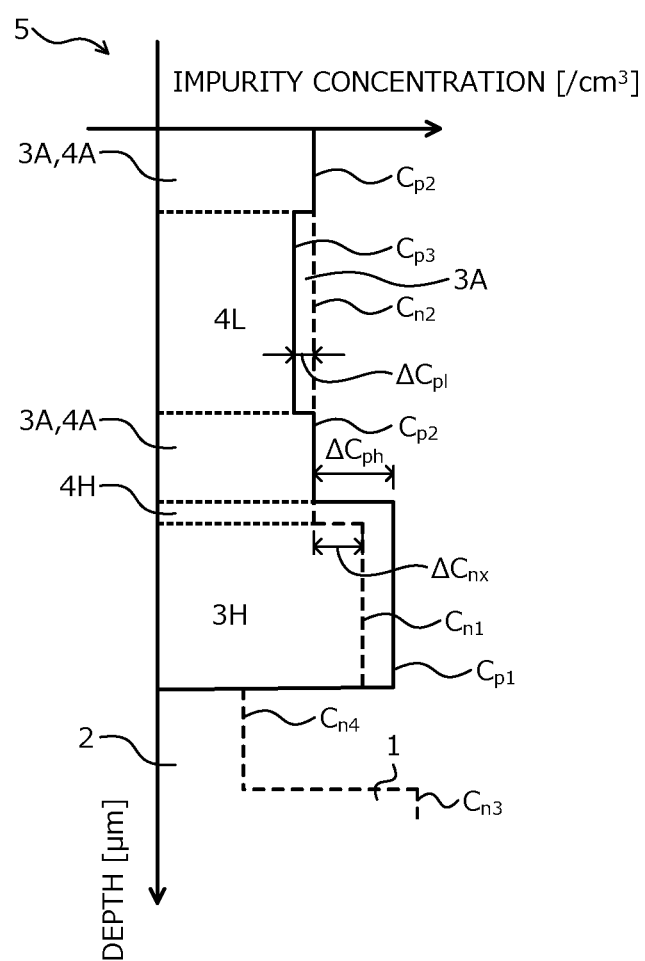
Figure 1C:
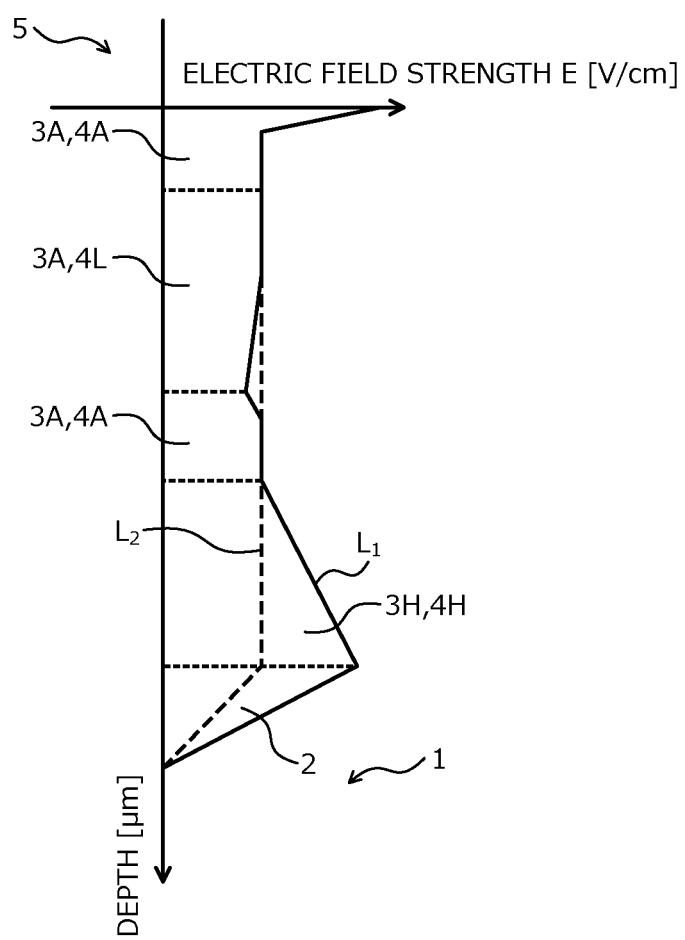

A structure of the semiconductor device according to a first embodiment will be described taking a planar gate superjunction MOSFET (hereinafter, SJ-MOSFET) as an example. FIGS. 1A, 1B, and 1C are diagrams of constituent regions of the semiconductor device according to the first embodiment. FIG. 1A depicts a cross-sectional view of the SJ-MOSFET. FIG. 1B depicts impurity concentration profiles in the depth direction (vertical direction) of the constituent regions of semiconductor base (semiconductor chip) 10. In FIG. 1B, a solid line is a p-type impurity concentration profile and a broken line is an n-type impurity concentration profile (similarly in FIGS. 9 to 11, 12A, 13 to 15). FIG. 1C depicts electric field strength distribution corresponding to the impurity concentration profile of FIG. 1B.

The semiconductor device according to the first embodiment depicted in FIG. 1A is a SJ-MOSFET in which the drift layer is a parallel pn layer 2b constituted by an n-type region (n-type drift region: first-conductivity-type semiconductor region) 3 having an increased impurity concentration and a p-type region (p-type partition region: second-conductivity-type semiconductor region) 4, alternately arranged repeatedly along a direction parallel to a base main surface. Further, the semiconductor device according to the first embodiment includes on main surfaces of the semiconductor base 10, a source electrode (first electrode) 11 and drain electrode (second electrode) 12, respectively, and is a vertical device in which the main current flows in the depth direction of the semiconductor base 10. In FIG. 1A, two unit cells (constituent unit of an element) of an active region are depicted and other unit cells adjacent to these unit cells and the edge termination region are omitted from the drawing (similarly in FIGS. 2 to 7).

The active region is a region in which the main current flows in the ON state. The edge termination region surrounds a periphery of the active region and is a region that mitigates the electric field of the parallel pn layer 2b on a base front surface (front surface of the semiconductor base 10) side and sustains the breakdown voltage. For example, the edge termination region has a general edge termination structure such as a guard ring, a field plate, a reduced surface field (RESURF), or the like. The semiconductor base 10 is a silicon (Si) substrate formed by stacking the parallel pn layer 2b on a front surface of an n⁺-type semiconductor substrate (semiconductor layer of a first conductivity type) 1, via an n⁻-type buffer layer (first-conductivity-type low-concentration semiconductor layer) 2a. The n⁻-type buffer layer 2a may be omitted.

The parallel pn layer 2b may be provided from the active region over to the edge termination region. The n-type drift region 3 and the p-type partition region 4 of the parallel pn layer 2b, for example, are arranged in a striped planar layout (not depicted) extending in a direction (direction into the drawing) orthogonal to the direction (horizontal direction) along which the n-type drift region 3 and the p-type partition region 4 are repeatedly arranged. Further, the n-type drift region 3 and the p-type partition region 4 of the parallel pn layer 2b may be arranged in a planar layout in which the p-type partition region 4 is arranged in a matrix shape and the n-type drift region 3 is arranged in grid-like shape surrounding a periphery of the p-type partition regions 4 (not depicted). The planar layout is an arrangement configuration and planar shape of parts viewed from the front surface side of the semiconductor base 10.

The n-type drift region 3 is arranged to be in contact with the n⁻-type buffer layer 2a at an end portion of the base rear surface (rear surface of the semiconductor base 10) and constitutes a portion of the current path of the main current flowing in the depth direction of the semiconductor base 10 in the ON state of the SJ-MOSFET. The n-type drift region 3 has a width (width in the horizontal direction) that is roughly the same as a width (width in the horizontal direction) of the p-type partition region 4. Impurity concentration profiles in the depth direction of the n-type drift region 3 and of the p-type partition region 4 are set so that the total impurity amount of the n-type impurity of the n-type drift region 3 and the total impurity amount of the p-type impurity of the p-type partition region 4 become roughly the same (FIG. 1B). These impurity concentration profiles will be described hereinafter.

In a surface layer of a front surface (surface on the parallel pn layer 2b side) of the semiconductor base 10, a p-type base region (first semiconductor region) 5 is selectively provided. The p-type base region 5 is arranged directly above the p-type partition region 4 (base front surface side) and is in contact with the p-type partition region 4. Further, the p-type base region 5 is provided having a width that is the width of the p-type partition region 4 positioned directly beneath the p-type base region 5 (base rear surface side) or greater, and is in contact with a surface n-type drift region 3B. The surface n-type drift region 3B is a region of the n-type drift region 3, between adjacent p-type base regions 5. In the p-type base region 5, an n⁺-type source region (second semiconductor region) 6 is selectively provided.

On the surface of a portion of the p-type base region 5 between the surface n-type drift region 3B and the n⁺-type source region 6, a gate insulating film 7 is provided from the surface n-type drift region 3B over to the n⁺-type source region 6. The gate insulating film 7, for example, is a silicon oxide (SiO₂) film and has a thickness of about 0.1 μm. On the gate insulating film 7, a gate electrode 8 is provided. The p-type base region 5, the n⁺-type source region 6, the gate insulating film 7, and the gate electrode 8 constitute a MOS gate of a planar gate (element structure).

The source electrode 11 is in contact with the p-type base region 5 and the n⁺-type source region 6, and is electrically connected to these regions. In the p-type base region 5, a p⁺-type contact region (not depicted) may be provided. In this case, the source electrode 11 is in contact with the p⁺-type contact region and the n⁺-type source region 6. Further, the source electrode 11 is electrically insulated from the gate electrode 8 by an interlayer insulating film 9. On a rear surface of the semiconductor base 10 (rear surface of the n⁺-type semiconductor substrate 1), the drain electrode 12 is provided, and is electrically connected to the n⁺-type semiconductor substrate 1 that is an n⁺-type drain layer.

In the SJ-MOSFET of FIGS. 1A, 1B, and 1C, when voltage that is positive with respect to the source electrode 11 is applied to the drain electrode 12 and voltage that is the threshold voltage or higher is applied to the gate electrode 8, an n-type inversion layer (channel) is formed at a surface region of the p-type base region 5 directly beneath the gate electrode 8 (portion facing the gate electrode 8 across the gate insulating film 7 in the depth direction). As a result, the main current flows through a path of the n⁺-type semiconductor substrate 1, the n⁻-type buffer layer 2a, the n-type drift region 3 (the surface n-type drift region 3B), the surface inversion layer of the p-type base region 5, and the n⁺-type source region 6. A state in which the main current flows is the ON state of the SJ-MOSFET.

On the other hand, when voltage that is positive with respect to the source electrode 11 is applied to the drain electrode 12 and voltage lower than the threshold voltage is applied to the gate electrode 8, the pn junction between the p-type base region 5 and the surface n-type drift region 3B is in a reversed biased state and therefore, the main current does not flow. In other words, the SJ-MOSFET maintains the OFF state. In the OFF state of the SJ-MOSFET, the depletion layer spreads from the pn junction between the p-type partition region 4 and the n-type drift region 3 and the drift layer is depleted. As a result, the resistance of the drift layer may be increased, enabling high breakdown voltage to be sustained.

The impurity concentration profiles of the n-type drift region 3 and the p-type partition region 4 of the parallel pn layer 2b in the depth direction will be described with reference to FIG. 1B. The vertical axis in FIG. 1B is the depth in a direction from a boundary (depth=0 μm) of the p-type base region 5 and p-type partition region 4 toward the drain side (similarly in FIG. 1C). The horizontal axis in FIG. 1B is the impurity concentration. In FIG. 1B, impurity concentration values of a portion where a solid line (a p-type impurity concentration profile of a portion 4A of the p-type partition region 4, on the source-side) and a broken line (an n-type impurity concentration profile of a portion 3A of the n-type drift region 3, on the source-side) overlap are substantially equal.

As depicted in FIG. 1B, the n-type drift region 3 is set to have an n-type impurity concentration profile in which an impurity concentration $C_{n1}$ of a portion 3H thereof on the drain-side is set to be higher than an impurity concentration $C_{n2}$ of the portion (basic component portion) 3A on the source-side by $\Delta C_{nx}(C_{n1}=C_{n2}+\Delta C_{nx})$. The impurity concentration $C_{n1}$ of the portion 3H of the n-type drift region 3 on the drain-side is equivalent to being uniform in the depth direction and is lower than an impurity concentration $C_{n3}$ of the n⁺-type semiconductor substrate 1 ($C_{n1}<C_{n3}$). The impurity concentration $C_{n2}$ of the portion 3A of the n-type drift region 3 on the source-side is substantially uniform in the depth direction and is higher than an impurity concentration $C_{n4}$ of the n⁻-type buffer layer 2a ($C_{n2}>C_{n4}$). Boundaries of the portions 3H, 3A of the n-type drift region 3 and of the surface n-type drift region 3B are indicated by finer broken lines than the n-type impurity concentration profile (similarly in FIGS. 1A, 1C, 9 to 15).

The portion 3H of the n-type drift region 3 on the drain-side is in contact with the n⁻-type buffer layer 2a. The portion 3A of the n-type drift region 3 on the source-side further includes the surface n-type drift region 3B. The width of the n-type drift region 3 is basically constant along the entire depth direction (refer to FIG. 1A). Therefore, the impurity concentrations $C_{n1}$, $C_{n2}$ of the portions 3H, 3A of the n-type drift region 3 are determined by the impurity amount (dose amount) per unit area of the portions 3H, 3A. In other words, in the n-type drift region 3, the portion 3H on the drain-side has a higher impurity amount as compared to the portion 3A on the source-side and the portion 3H in which the impurity concentration is locally higher in the depth direction is at a boundary with the n⁻-type buffer layer 2a.

The p-type partition region 4 is set to have a p-type impurity concentration profile in which an impurity concentration $C_{p1}$ of a portion 4H thereof on the drain-side is set to be higher than an impurity concentration $C_{p2}$ of the portion (basic component portion) 4A on the source-side by $\Delta C_{ph}$ ($C_{p1}=C_{p2}+\Delta C_{ph}$). The impurity concentration $C_{p1}$ of the portion 4H of the p-type partition region 4 on the drain-side is equivalent to being uniform in the depth direction. Further, the impurity concentration $C_{p1}$ of the portion 4H of the p-type partition region 4 on the drain-side is higher than the impurity concentration $C_{n1}$ of the portion 3H of the n-type drift region 3 on the drain-side and lower than the impurity concentration $C_{n3}$ of the n⁺-type semiconductor substrate 1 ($C_{n1}<C_{p1}<C_{n3}$).

Further, the p-type impurity concentration profile is set such that in the portion 4A of the p-type partition region 4 on the source-side, an impurity concentration $C_{p3}$ of a portion 4L central in the depth direction of the portion 4A is relatively lower than the impurity concentration $C_{p2}$ of the other portions by $\Delta C_{pl}$ ($C_{p3}=C_{p2}-\Delta C_{pl}$). The impurity concentration $C_{p2}$ of the portion 4A of the p-type partition region 4 on the source-side is substantially uniform in the depth direction and is basically equal to the impurity concentration $C_{n2}$ of the portion 3A of the n-type drift region 3 on the source-side ($C_{p2}=C_{n2}$). In the portion 4A of the p-type partition region 4 on the source-side, the impurity concentration $C_{p3}$ of the portion 4L central in the depth direction of the portion 4A is substantially uniform in the depth direction and higher than the impurity concentration $C_{n4}$ of the n⁻-type buffer layer 2a ($C_{p3}>C_{n4}$). Boundaries of the portions 4H, 4A, 4L of the p-type partition region 4 are indicated by finer broken lines than the n-type impurity concentration profile (similarly in FIGS. 1A, 1C, 9 to 15).

The portion 4H of the p-type partition region 4 on the drain-side is in contact with the n⁻-type buffer layer 2a. In the p-type partition region 4, a basic component portion (i.e., portion 4A) is arranged between the portion 4H on the drain-side having the impurity concentration $C_{p1}$ that is highest and the portion 4L having the impurity concentration $C_{p3}$ that is lowest. A basic component portion is further arranged between the p-type base region 5 and the portion 4L of the p-type partition region 4 having the impurity concentration $C_{p3}$ that is lowest. The boundary of the portion 4H of the p-type partition region 4 on the drain-side and the portion 4A on the source-side is positioned at a same depth as that of the boundary of the portion 3H of the n-type drift region 3 on the drain-side and the portion 3A on the source-side, or farther on the source side than the boundary of the portion 3H of the n-type drift region 3 on the drain-side and the portion 3A on the source-side.

The width of the p-type partition region 4 is basically constant along the entire depth direction (refer to FIG. 1A). Therefore, the impurity concentrations $C_{p1}$, $C_{p2}$, $C_{p3}$ of the portions 4H, 4A, 4L of the p-type partition region 4 are determined by the impurity amount (dose amount) per unit area of the portions 4H, 4A, 4L. In other words, in the p-type partition region 4, the portion 4H has an impurity amount that is locally higher compared to the basic component portion and this portion 4H in which the impurity concentration in the depth direction is locally higher is at a boundary with the n⁻-type buffer layer 2a. In addition, in the p-type partition region 4, in the portion 4A on the source-side, the portion 4L having an impurity amount that is relatively lower than that of the portion 4A and an impurity concentration that is made lower is near a center of the portion 4A in the depth direction.

Further, the impurity concentrations $C_{n1}$, $C_{n2}$ of the portions 3H, 3A of the n-type drift region 3 and the impurity concentrations $C_{p1}$, $C_{p2}$, $C_{p3}$ of the portions 4H, 4A, 4L of the p-type partition region 4 satisfy equation (1), where, $t_{n1}$, $t_{n2}$ are respectively thicknesses of the portions 3A, 3H of the n-type drift region 3; $t_{p1}$, $t_{p3}$ are respectively thicknesses of portions of the p-type partition region 4 farther on the drain-side and the source-side from the portion 4L central in the depth direction and having the impurity concentration $C_{p3}$ that is lowest in a basic component portion (portion 4A); $t_{p2}$, $t_{p4}$ are respectively thicknesses of the portion 4L having the impurity concentration $C_{p3}$ that is lowest and the portion 4H having the impurity concentration $C_{p1}$ that is highest, in the p-type partition region 4.

$$C_{n2} \cdot t_{n1}+(C_{n2}+\Delta C_{nx}) \cdot t_{n2}=C_{p2} \cdot t_{p1}+(C_{p2}-\Delta C_{pl}) \cdot t_{p2}+ C_{p2} \cdot t_{p3}+(C_{p2}+\Delta C_{ph}) \cdot t_{p4} \quad (1)$$

The thickness $t_{n2}$ of the portion 3H of the n-type drift region 3 on the drain-side may be preferably about ⅕ times to ¼ times a thickness T of the parallel pn layer 2b (⅕·T≤$t_{n2}$≤¼·T). The thickness $t_{p4}$ of the portion 4H of the p-type partition region 4 on the drain-side may be preferably about ⅕ times to ¼ times the thickness T of the parallel pn layer 2b (⅕·T≤$t_{p4}$≤¼·T). The thickness $t_{p4}$ of the portion 4H of the p-type partition region 4 on the drain-side may be the same as the thickness $t_{n2}$ of the portion 3H of the n-type drift region 3 on the drain-side. Here, the thicknesses $t_{n2}$, $t_{p4}$ of the portions 3H, 4H are the depths from the boundary of the n⁻-type buffer layer 2a and the n-type drift region 3 toward the source-side.

The thickness $t_{p2}$ of the portion 4L having the impurity concentration $C_{p3}$ that is lowest of the p-type partition region 4 may be preferably about ⅕ times to ²⁄₇ times the thickness T of the parallel pn layer 2b (⅕·T≤$t_{p2}$≤²⁄₇·T). A central depth position (a depth position half the thickness $t_{p2}$) of the portion 4L having the impurity concentration $C_{p3}$ that is lowest of the p-type partition region 4 may be preferably a depth D of about ⁶⁄₁₁ times to ⁸⁄₁₁ times the thickness T of the parallel pn layer 2b, from the boundary of the surface n-type drift region 3B and the gate insulating film 7 (⁶⁄₁₁·T≤$t_{p2}$≤⁸⁄₁₁·T). The thickness T of the parallel pn layer 2b is a thickness from the boundary of the n⁻-type buffer layer 2a and the n-type drift region 3, to the boundary of the surface n-type drift region 3B and the gate insulating film 7 (T=$t_{n1}$+$t_{n2}$).

The impurity concentration profiles of the n-type drift region 3 and the p-type partition region 4 of the parallel pn layer 2b in the depth direction satisfy equation (1) whereby the charge balance of the n-type drift region 3 and the p-type partition region 4 is maintained and the total impurity amounts of the n-type drift region 3 and the p-type partition region 4 of the parallel pn layer 2b become roughly the same. As a result, the breakdown voltage may be enhanced without increasing the ON-state resistance. In other words, the tradeoff relationship of ON-state resistance reduction and breakdown voltage enhancement is improved and desired characteristics of the SJ-MOSFET depicted in FIG. 1A are obtained.

On the other hand, when the impurity concentration profiles of the n-type drift region 3 and the p-type partition region 4 of the parallel pn layer 2b, in the depth direction, do not satisfy equation (1), i.e., when the charge balance of the n-type drift region 3 and the p-type partition region 4 is lost, according to the tradeoff relationship, the ON-state resistance increases or the breakdown voltage decreases and desired characteristics of the SJ-MOSFET are not obtained. The reason for this is that, a portion where the electric field is high exhibits electric field strength distribution $L_2$ distributed along the pn junction between the p-type partition region and the n-type drift region (refer to FIG. 1C).

Figure 12A:
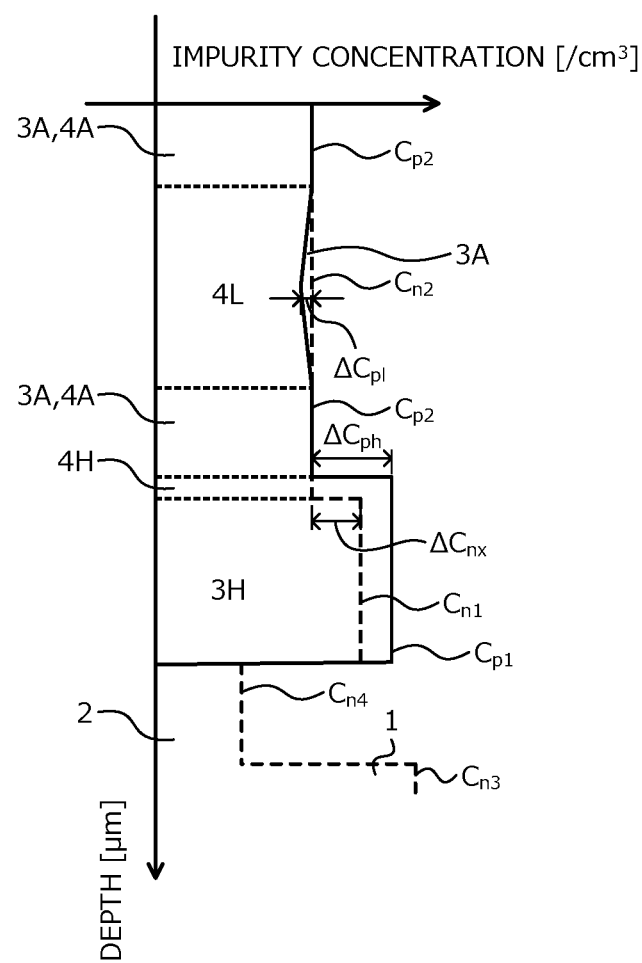
FIGS. 12A and 12B are diagrams of constituent regions of the semiconductor device according to a third embodiment.
Figure 12B:
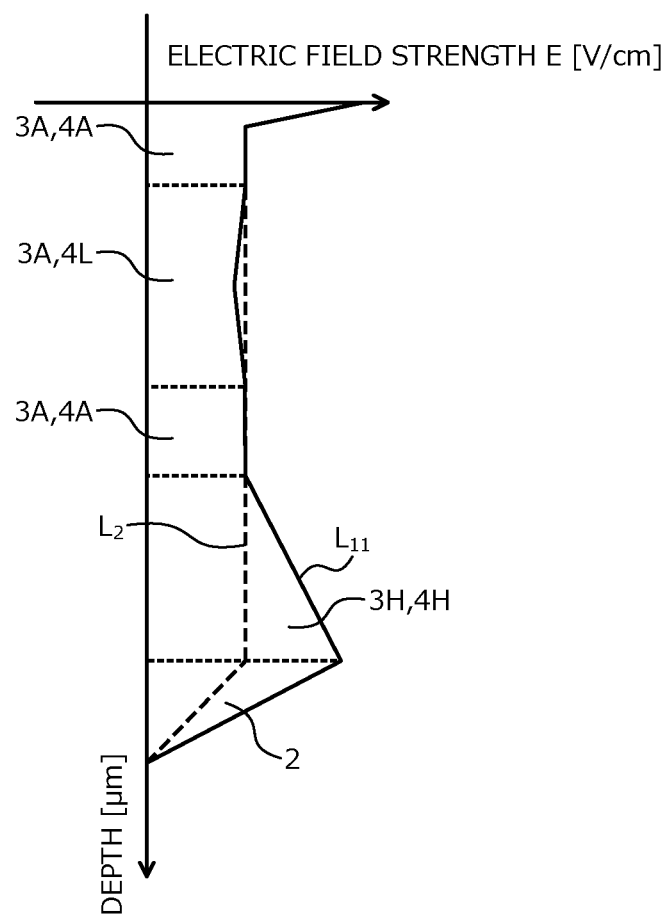

In FIG. 1C, a solid line is electric field strength distribution $L_1$, in the depth direction, of the p-type partition region 4 of the SJ-MOSFET in FIG. 1A; and a broken line is the electric field strength distribution $L_2$, in the depth direction, of the p-type partition region of a conventional SJ-MOSFET (not depicted) (similarly in FIG. 12B). The conventional SJ-MOSFET includes a parallel pn layer in which the total impurity amounts of the n-type drift region and the p-type partition region are roughly the same, and the impurity concentrations of the respective regions are roughly uniform in the depth direction. Therefore, as indicated by the broken line in FIG. 1C, in the conventional SJ-MOSFET, the electric field strength distribution $L_2$ is constant along the entire depth direction.

On the other hand, in the SJ-MOSFET in FIG. 1A, the parallel pn layer 2b exhibits the impurity concentration profile described above and as indicated by the solid line in FIG. 1C, the electric field strength distribution $L_1$ shows substantially constant electric field strength at the portion 4A of the p-type partition region 4 on the source-side. Additionally, the electric field strength distribution $L_1$ shows increasing electric field strength accompanying increased depth on the drain side from the boundary of the portion 4A of the p-type partition region 4 on the source-side and the portion 4H on the drain-side, with the electric field strength becoming highest at the boundary of the portion 4H of the p-type partition region 4 on the drain-side and the n$^-$-type buffer layer 2a. The electric field strength at the portion 4H of the p-type partition region 4 on the drain-side is higher than the electric field strength at the same portion of the conventional SJ-MOSFET.

Consequent to the electric field strength of the portion 4H of the p-type partition region 4 on the drain-side increasing in this manner, the electric field strength of the portion 3H of the n-type drift region 3 on the drain-side also increases. Therefore, a higher voltage may be applied to the n-type drift region 3, enhancing the breakdown voltage. In the portion 4L having the impurity concentration $C_{p3}$ that is lowest of the p-type partition region 4, although the voltage (breakdown voltage) that may be applied to the parallel pn layer 2b becomes lower toward the drain-side as compared to the same portion of the conventional SJ-MOSFET, the decreased breakdown voltage at the portion 4L is compensated by the increased breakdown voltage at the portion 4H of the p-type partition region 4 on the drain-side. The portion for which the breakdown voltage is compensated by the increased breakdown voltage at the portion 4H of the p-type partition region 4 on the drain-side (i.e., the portion 4L having the impurity concentration $C_{p3}$ that is lowest) is indicated by hatching in FIG. 1A.

Further, in the n-type drift region 3, the impurity concentration $C_{n1}$ of the portion 3H on the drain-side is higher than the impurity concentration $C_{n2}$ of the portion 3A on the source-side whereby the ON-state resistance may be reduced compared to a conventional structure (for example, refer to Japanese Patent No. 4768259) in which only a portion of the p-type partition region on the drain-side has a relatively high impurity concentration. As a result, the electric field may be caused to further concentrate at the portion 4H of the p-type partition region 4 on the drain-side, enabling the breakdown voltage to be further enhanced. Accordingly, in the present invention, both reduction of the ON-state resistance and enhancement of the breakdown voltage become possible. Further, as described next, the present invention has a structure facilitating high avalanche tolerance.

Ordinarily, avalanche tolerance is significantly affected adversely by parasitic npn bipolar transistor behavior in which the n$^+$-type source region acts as an emitter, the p-type base region acts as a base, and the surface n-type drift region acts as a collector. Further, the ease of parasitic npn bipolar transistor behavior occurring differs according to the site where avalanche breakdown occurs and whether avalanche tolerance may be increased is known to largely depend on the site at which avalanche breakdown occurs. For example, when the impurity concentration of the p-type partition region is uniform in the depth direction as in a conventional SJ-MOSFET, the site at which avalanche breakdown occurs is the boundary of the p-type base region and the p-type partition region, or the boundary of the p-type partition region and the n$^-$-type buffer layer.

When the parallel pn layer is formed with a condition (impurity concentration profile, etc.) that avalanche breakdown occurs at the boundary of the p-type base region and the p-type partition region, parasitic npn bipolar transistor behavior is facilitated, reducing avalanche tolerance. When the parallel pn layer is formed with a condition that avalanche breakdown occurs at the boundary of the p-type partition region and the n$^-$-type buffer layer, occurrence of the parasitic npn bipolar transistor behavior becomes difficult, increasing avalanche tolerance. The site at which avalanche breakdown occurs is a site in the parallel pn layer where the electric field strength is high, and the electric field strength distribution in the parallel pn layer fluctuates consequent to impurity concentration variation of the n-type drift region and the p-type partition region. Therefore, avalanche tolerance is dependent on process variation. Accordingly, in a conventional structure in which avalanche breakdown may occur at the boundary of the p-type base region and the p-type partition region consequent to process variation, avalanche tolerance reproducibility cannot be increased very well.

In contrast, in the SJ-MOSFET depicted in FIG. 1A, the impurity concentration $C_{p1}$ of the portion 4H of the p-type partition region 4 on the drain-side is set to be the highest whereby the electric field strength at the boundary of the portion 4H of the p-type partition region 4 on the drain-side and the n$^-$-type buffer layer 2a becomes highest. Therefore, even when there is some process variation, the impurity concentration $C_{p1}$ of the portion 4H of the p-type partition region 4 on the drain-side does not easily change from being the highest and avalanche breakdown usually occurs at the boundary of the p-type partition region 4 and the n$^-$-type buffer layer 2a. Thus, independent of process variation, the site at which avalanche breakdown occurs is determined as a single site (the boundary of the p-type partition region 4 and the n$^-$-type buffer layer 2a). In addition, as described, the parasitic npn bipolar transistor behavior does not easily occur, whereby decreases in avalanche tolerance consequent to the parasitic npn bipolar transistor behavior do not easily occur. Accordingly, good reproducibility of high avalanche tolerance may be obtained.

Figure 2:
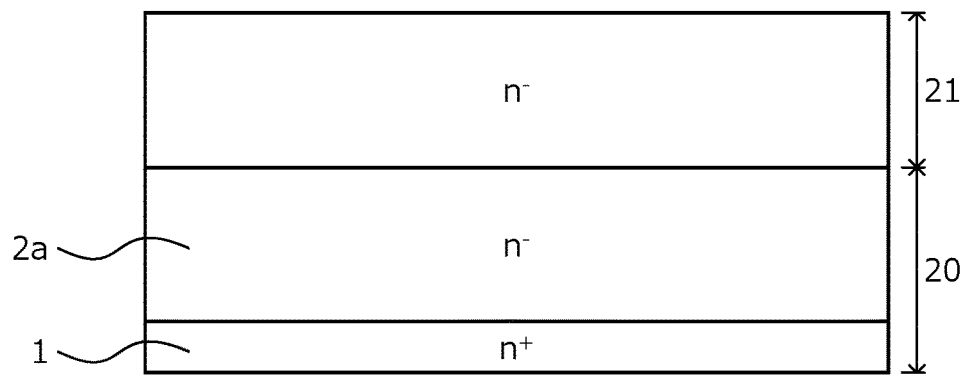
FIGS. 2, 3, 4, 5, 6, and 7 are cross-sectional views of the semiconductor device according to the first embodiment during manufacture.

A method of manufacturing a semiconductor device according to the first embodiment will be described. FIGS. 2, 3, 4, 5, 6, and 7 are cross-sectional views of the semiconductor device according to the first embodiment during manufacture. FIG. 8 is a diagram of p-type impurity implantation amount distribution of constituent regions of the semiconductor device according to the first embodiment during manufacture. In FIG. 8, the horizontal axis is the depth from the source-side toward the drain-side and the vertical axis is the p-type impurity implantation amount distribution of a portion corresponding to a formation region of the p-type partition region 4. First, as depicted in FIG. 2, an epitaxial substrate (semiconductor wafer) 20 is prepared by forming the n$^-$-type buffer layer 2a on the front surface of the n$^+$-type semiconductor substrate (silicon substrate) 1 by epitaxial growth.

Next, on a front surface (surface on the n$^-$-type buffer layer 2a side) of the epitaxial substrate 20, an n$^-$-type semiconductor layer 21 is formed by epitaxial growth. The n$^-$-type semiconductor layer 21 at this point is regarded as an n$^-$-type epitaxial layer 21a. This n$^-$-type epitaxial layer 21a first formed by epitaxial growth may be preferably thicker than a portion (n$^-$-type epitaxial layer 21b) formed on the n$^-$-type epitaxial layer 21a by a single epitaxial growth session at a process (described hereinafter) to increase the thickness of n$^-$-type semiconductor layer 21.

The reason for this is as follows. In the n$^-$-type epitaxial layer 21a, an n-type region 31 and a p-type region 32 are formed at a process (described hereinafter). The n-type region 31 and the p-type region 32 are suppressed from diffusing into the n$^-$-type buffer layer 2a by annealing (heat treatment) for impurity diffusion (described hereinafter) and decreases in the thickness of the n$^-$-type buffer layer 2a are suppressed. Since the breakdown voltage may be further enhanced the greater the thickness of the n$^-$-type buffer layer 2a is, the n$^-$-type buffer layer 2a may be preferably left having the thickness at the time of deposition on the n$^+$-type semiconductor substrate 1.

Figure 3:
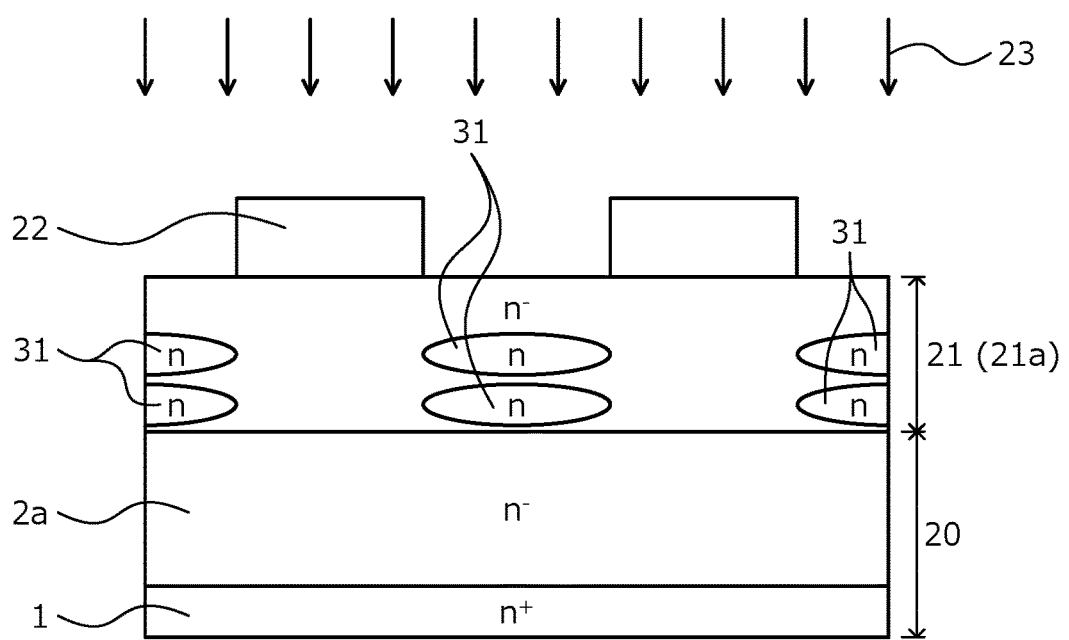

Next, as depicted in FIG. 3, a resist mask 22 having an opening corresponding to a formation region of the n-type drift region 3 is formed on the n$^-$-type epitaxial layer 21a. Next, the same resist mask 22 is used as a mask and ion implantation 23 of an n-type impurity such as, for example, phosphorus (P) is performed multiple times to form the portion 3H of the n-type drift region 3 on the drain-side. At this time, the multiple sessions of the ion implantation 23 are performed with substantially the same dose amount and respectively differing accelerating voltages.

By the multiple sessions of the ion implantation 23 for which the accelerating voltages differ, in the formation region of the n-type drift region 3, the n-type region 31 is selectively formed in plural (of a count that is the same as the number of sessions of the ion implantation 23) having substantially equal impurity implantation amounts (dose amounts), the n-type regions 31 being formed so as to face each other in the depth direction. Further, by adjusting the accelerating voltage of the ion implantation 23 having the shortest range (low accelerating voltage), the depth position of the boundary of the portion 3H of the n-type drift region 3 on the drain-side and the portion 3A on the source-side may be adjusted.

In particular, for example, two sessions of the ion implantation 23 are assumed to be performed. In this case, in the first session of the ion implantation 23, the n-type region 31 is selectively formed at a portion of the n$^-$-type epitaxial layer 21a near the n$^-$-type buffer layer 2a. In the first session of the ion implantation 23, for example, the accelerating voltage may be within a range from about 1.2 MeV to 2.2 MeV, and the dose amount may be within a range from about $1\times10^{12}/cm^2$ to $1\times10^{13}/cm^2$.

In the second session of the ion implantation 23, the n-type region 31 is selectively formed in the n$^-$-type epitaxial layer 21a, in a central portion in the depth direction. In the second session of the ion implantation 23, the accelerating voltage is lower than that of the first session of the ion implantation 23 and, for example, is within a range from about 50 keV to 150 keV, and the dose amount is substantially the same as that of the first session of the ion implantation 23. The formation sequence of these two n-type regions 31 may be variously changed.

Figure 4:
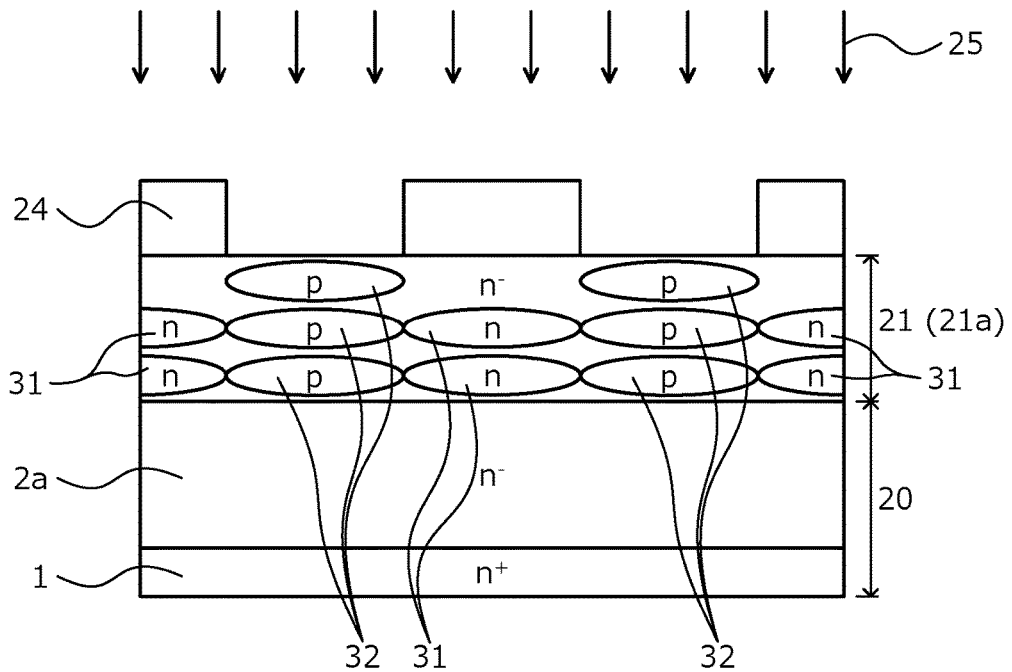

Next, as depicted in FIG. 4, after the resist mask 22 is removed, a resist mask 24 having an opening corresponding to the formation region of the p-type partition region 4 is formed on the n$^-$-type epitaxial layer 21a. Next, the same resist mask 24 is used as a mask and ion implantation 25 of a p-type impurity such as, for example, boron (B), etc. is performed multiple times to form the portion 4H of the p-type partition region 4 on the drain-side. The dose amount of the ion implantation 25 is substantially the same as the dose amount of the ion implantation 23 for forming the n-type regions 31. The number of sessions of the ion implantation 25 is greater than the number of sessions of the ion implantation 23 for forming the n-type regions 31. The multiple sessions of the ion implantation 25 are performed by respectively differing accelerating voltages.

By the multiple sessions of the ion implantation 25 for which the accelerating voltages differ, in the formation region of the p-type partition region 4, the p-type region 32 is selectively formed in plural (of a count that is the same as the number of sessions of the ion implantation 25) having substantially equal impurity implantation amounts, the p-type regions 32 being formed so as to face each other in the depth direction. Further, by adjusting the accelerating voltage of the ion implantation 25 having the shortest range, the depth position of the boundary of the portion 4H of the p-type partition region 4 on the drain-side and the portion 4A on the source-side may be adjusted.

In particular, for example, three sessions of the ion implantation 25 are assumed to be performed. In this case, in the first session of the ion implantation 25, the p-type region 32 is selectively formed at a portion of the n$^-$-type epitaxial layer 21a near the n$^-$-type buffer layer 2a. The p-type region 32, for example, is formed at substantially the same depth as the n-type region 31 formed at a position that is deepest. In the first session of the ion implantation 25, the accelerating voltage may be within a range from about 1.0 MeV to 1.5 MeV. The dose amount of the first session of the ion implantation 25 is substantially the same as the dose amount of the first session of the ion implantation 23.

In the second session of the ion implantation 25, the p-type region 32 is selectively formed in the n$^-$-type epitaxial layer 21a, in a central portion in the depth direction. The p-type region 32, for example, is formed at substantially the same depth as the n-type region 31 formed in the n$^-$-type epitaxial layer 21a, in the central portion in the depth direction. In the second session of the ion implantation 25, the accelerating voltage is lower than that of the first session of the ion implantation 25 and the dose amount is substantially the same as that of the first session of the ion implantation 25. The accelerating voltage of the second session of the ion implantation 25, for example, may be within a range from about 50 keV to 200 keV.

In the third session of the ion implantation 25, the p-type region 32 is selectively formed at a portion of the n⁻-type epitaxial layer 21a shallower than a center in the depth direction. In the third session of the ion implantation 25, the accelerating voltage is lower than that of second session of the ion implantation 25 and the dose amount is substantially the same as that of the first session of the ion implantation 25. The accelerating voltage of the third session of the ion implantation 25, for example, may be within a range from about 25 keV to 100 keV. The formation sequence of these three p-type regions 32 may be variously changed.

In this manner, in the n⁻-type epitaxial layer 21a, the number of the p-type regions 32 facing each other in the depth direction is made to be greater than the number of the n-type regions 31 facing each other in the depth direction. As a result, even when the dose amount of one session of the ion implantation 25 is substantially the same as the dose amount of one session of the ion implantation 23, the total implantation amount of the p-type impurity in the n⁻-type epitaxial layer 21a may be made higher than the total implantation amount of the n-type impurity. In other words, the impurity implantation amount of the portion 4H of the p-type partition region 4 on the drain-side may be made higher than the total impurity implantation amount of the portion 3H of the n-type drift region 3 on the drain-side.

Figure 5:
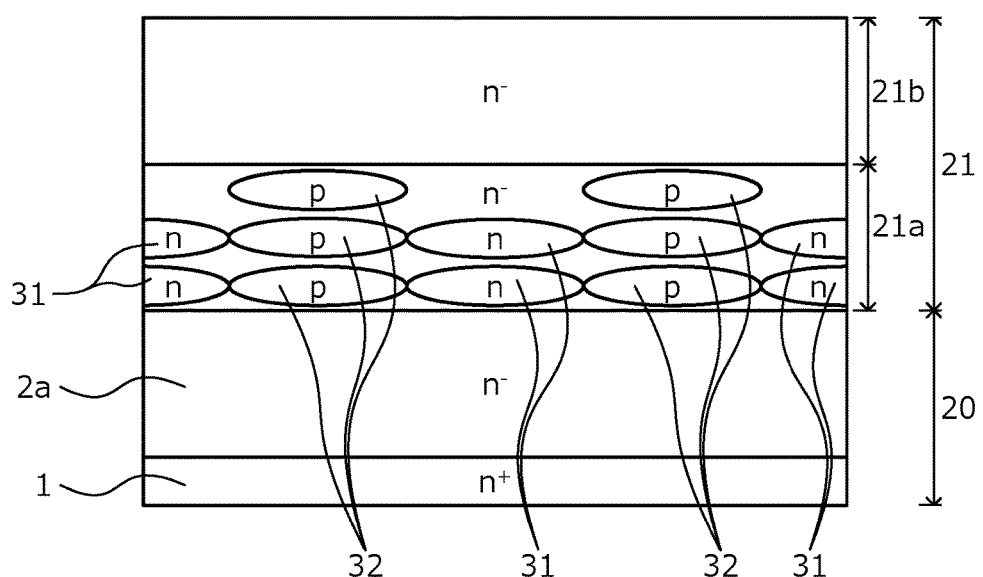

Next, as depicted in FIG. 5, after the resist mask 24 is removed, the n⁻-type epitaxial layer 21b is grown on the n⁻-type epitaxial layer 21a whereby the thickness of the n⁻-type semiconductor layer 21 is increased.

Figure 6:
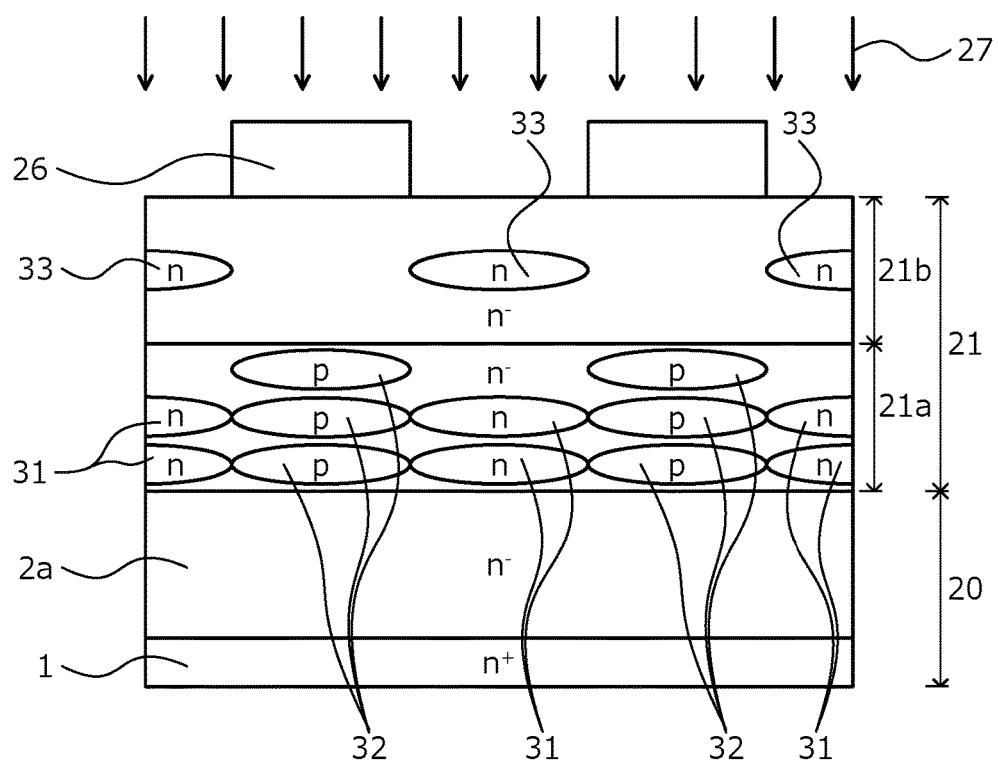

Next, as depicted in FIG. 6, a resist mask 26 having an opening corresponding to the formation region of the n-type drift region 3 is formed on the n⁻-type epitaxial layer 21b. Next, the resist mask 26 is used as a mask and ion implantation 27 of an n-type impurity such as, for example, phosphorus, etc. is performed to form the portion 3A of the n-type drift region 3 on the source-side. The number of the ion implantation 27 sessions (for example, one session) is fewer than the number of sessions of the ion implantation 23 for forming the n-type regions 31. The dose amount of the ion implantation 27 is substantially the same as the dose amount of the ion implantation 23 for forming the n-type regions 31.

In this manner, the number of sessions of the ion implantation 27 performed in the n⁻-type epitaxial layer 21b of one step (one layer) may be made fewer than the number of sessions of the ion implantation 23 performed in the n⁻-type epitaxial layer 21a of one step. As a result, even when the dose amount of one session the ion implantation 27 is substantially the same as the dose amount of one session of the ion implantation 23, the total implantation amount of the n-type impurity in the n⁻-type epitaxial layer 21b may be made lower than the total implantation amount of the n-type impurity in the n⁻-type epitaxial layer 21a. Therefore, the impurity implantation amount of the portion 3A of the n-type drift region 3 on the source-side may be made to be lower than the impurity implantation amount of the portion 3H of the n-type drift region 3 on the drain-side.

In particular, for example, only one session of the ion implantation 27 is performed for the n⁻-type epitaxial layer 21b of one step and an n-type region 33 is selectively formed in the n⁻-type epitaxial layer 21b, in a central portion in the depth direction, for example. In this case, the accelerating voltage of the ion implantation 27 is substantially the same as that of the second session of the ion implantation 23 for forming the n-type regions 31.

Figure 7:
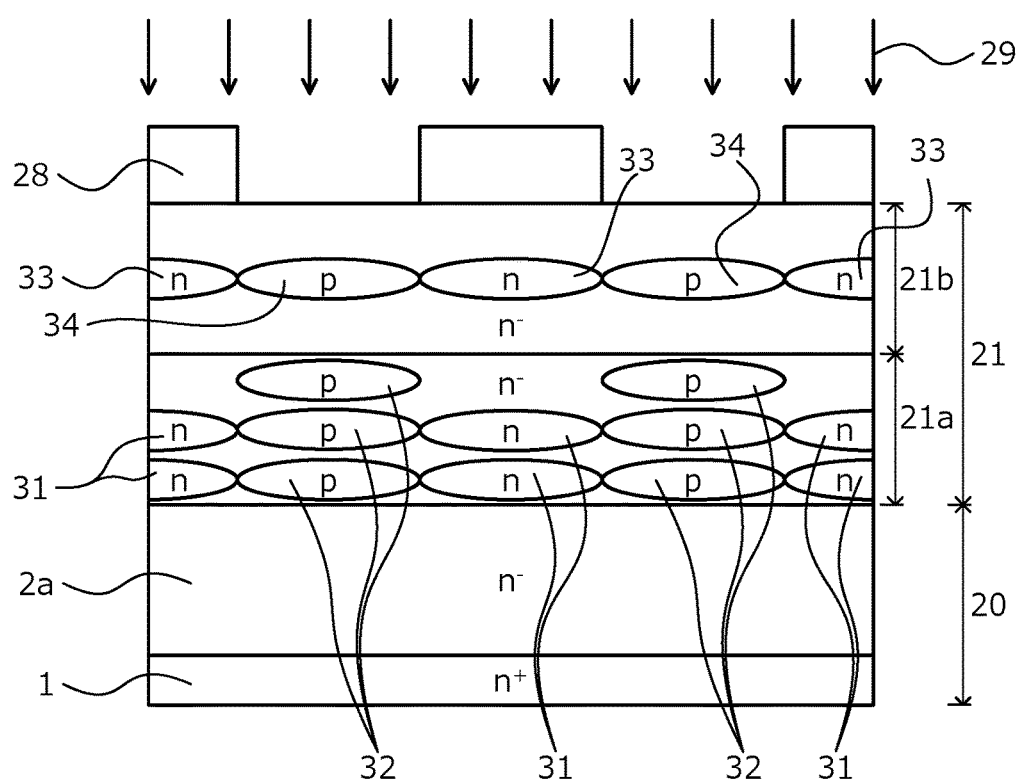
Figure 8:
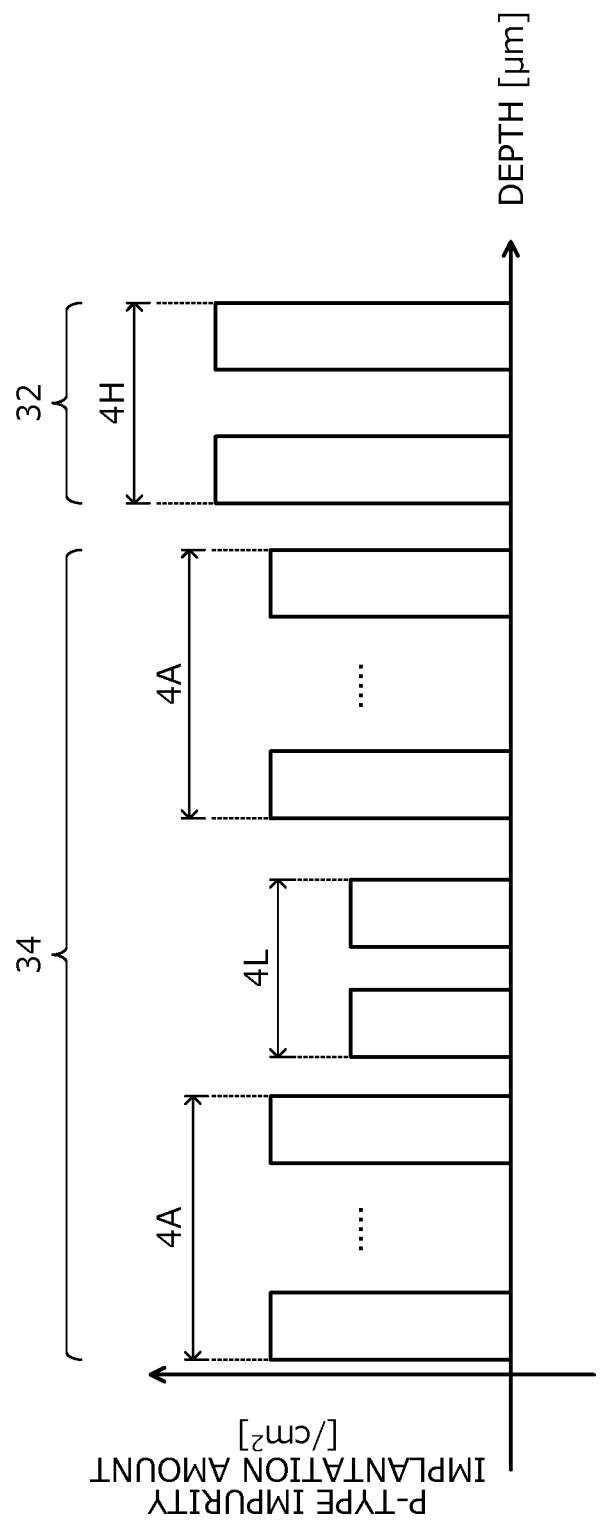
FIG. 8 is a diagram of p-type impurity implantation amount distribution of constituent regions of the semiconductor device according to the first embodiment during manufacture.

Next, as depicted in FIG. 7, after the resist mask 26 is removed, a resist mask 28 having an opening corresponding to the formation region of the p-type partition region 4 is formed on the n⁻-type epitaxial layer 21b. Next, the resist mask 28 is used as a mask and ion implantation 29 of a p-type impurity such as, for example, boron, etc. is performed to form the portion 4A of the p-type partition region 4 on the source-side. The number of sessions of the ion implantation 29 (for example, one session) is fewer than the number of sessions of the ion implantation 25 for forming the p-type regions 32. The dose amount of the ion implantation 29 is substantially the same as the dose amount of the ion implantation 25 for forming the p-type regions 32.

In this manner, the number of sessions of the ion implantation 29 performed in the n⁻-type epitaxial layer 21b of one step is made to be fewer than the number of sessions of the ion implantation 25 performed in the n⁻-type epitaxial layer 21a of one step. As a result, even when the dose amount of one session of the ion implantation 29 is substantially the same as the dose amount of one session of the ion implantation 25, the total implantation amount of the p-type impurity in the n⁻-type epitaxial layer 21b may be made lower than the total implantation amount of the p-type impurity in the n⁻-type epitaxial layer 21a. Therefore, the impurity implantation amount of the portion 4A of the p-type partition region 4 on the source-side may be made lower than the impurity implantation amount of the portion 4H of the p-type partition region 4 on the drain-side.

In particular, for example, only one session of the ion implantation 29 is performed with respect to the n⁻-type epitaxial layer 21b of one step and a p-type region 34 is selectively formed in the n⁻-type epitaxial layer 21b, for example, in a central portion in the depth direction. In this case, the accelerating voltage of the ion implantation 29 is the same as that of the second session of the ion implantation 25 for forming the p-type regions 32. As a result, at substantially the same depth in the n⁻-type epitaxial layer 21b, the n-type regions 33 and the p-type regions 34 of equal impurity implantation amounts are formed. Subsequently, the resist mask 28 is removed.

A set of processes including formation of the n⁻-type epitaxial layer 21b, formation of the n-type regions 33, and formation of the p-type regions 34 is repeatedly performed until the n⁻-type semiconductor layer 21 becomes a predetermined thickness (the thickness T of the parallel pn layer 2b). In the uppermost layer of the n⁻-type epitaxial layer 21b, ion implantation forming the n-type region 33 and the p-type region 34 is not performed.

When the set of processes are repeatedly performed, the impurity implantation amount of the n-type regions 33 may be lower than the impurity implantation amount of the n-type regions 31. In this case, the impurity implantation amount of the n-type regions 31 (the portion 3H of the n-type drift region 3 on the drain-side) is set to be about 1.1 times to 1.3 times the impurity implantation amount of the n-type regions 33 (the portion 3A of the n-type drift region 3 on the source-side). The impurity implantation amount of the p-type regions 34 may be lower than the impurity implantation amount of the p-type regions 32 (refer to FIG. 8). In this case, the impurity implantation amount of the p-type regions 32 (the portion 4H of the p-type partition region 4 on the drain-side) is set to be about 1.1 times to 1.3 times the impurity implantation amount of the p-type regions 34 (the portion 4A of the p-type partition region 4 on the source-side).

When the p-type regions 34 that become the portion 4L having the impurity concentration $C_{p3}$ that is lowest of the p-type partition region 4 are formed, the impurity implantation amount is $\Delta C_p$, (refer to FIG. 1B) less than that when the other the p-type regions 34 are formed (refer to FIG. 8). The impurity implantation amount of the p-type regions 34 that become the portion 4L having the impurity concentration $C_{p3}$ that is lowest of the p-type partition region 4 is about 0.85 times to 0.95 times the impurity implantation amount of the other p-type regions 34. The impurity implantation amounts of the regions 31 to 34 are set so as to satisfy the impurity implantation amount ranges whereby at the time of annealing for impurity diffusion described hereinafter, the regions 31 to 34 may be made to be diffuse in the horizontal direction to substantially the same extent. Therefore, the widths of the n-type drift region 3 and the p-type partition region 4 may be kept substantially constant in the depth direction.

Further, the impurity concentration profiles of the n-type drift region 3 and the p-type partition region 4 in the depth direction (refer to FIG. 1B) are determined equivalently by the impurity implantation amounts of the portions 3H, 3A of the n-type drift region 3 and the portions 4H, 4A of the p-type partition region 4. The impurity implantation amounts of the portion 3H of the n-type drift region 3 on the drain-side and the portion 4H of the p-type partition region 4 on the drain-side may be relatively increased by increasing the number of sessions of the ion implantations 23, 25 as described above. Therefore, even when the n-type drift region 3 and the p-type partition region 4 are formed setting the impurity implantation amounts of the regions 31 to 34 within the impurity implantation amount ranges above, a predetermined impurity concentration profile of the n-type drift region 3 and the p-type partition region 4 in the depth direction is obtained.

Next, annealing for impurity diffusion is performed. By the annealing, in the n⁻-type epitaxial layer 21a, the n-type regions 31 facing each other in the depth direction are connected, forming the portion 3H of the n-type drift region 3 on the drain-side. In n⁻-type epitaxial layer 21a, the p-type regions 32 facing each other in the depth direction are connected, forming the portion 4H of the p-type partition region 4 on the drain-side. Further, in the n⁻-type epitaxial layers 21b, the n-type regions 33 formed therein facing each other in the depth direction are connected, forming the portion 3A of the n-type drift region 3 on the source-side. The portion 3A of the n-type drift region 3 on the source-side is connected to the portion 3H of the n-type drift region 3 on the drain-side. In the n⁻-type epitaxial layers 21b, the p-type regions 34 formed therein facing each other in the depth direction are connected, forming the portion 4A of the p-type partition region 4 on the source-side. The portion 4A of the p-type partition region 4 on the source-side is connected to the portion 4H of the p-type partition region 4 on the drain-side.

Here, each of the n-type regions 33 diffuses having a substantially circular cross-sectional shape having a center at a depth position of the range of the ion implantation 27 and diffuses to an extent that the n-type region 33 is in contact with or slightly overlaps facing n-type regions 33 in the depth direction and facing p-type regions 34 in the horizontal direction. In other words, the portion 3A of the n-type drift region 3 on the source-side is formed by the n-type regions 33, which have a substantially circular cross-sectional shape, being connected to an extent that the n-type regions 33 are in contact with or slightly overlap each other in the depth direction. Therefore, the impurity concentration profile of the portion 3A of the n-type drift region 3 on the source-side is substantially uniform in the depth direction.

Each of the p-type regions 34 diffuses having a substantially circular cross-sectional shape having a center at a depth position of the range of the ion implantation 29 and diffuses to an extent that the p-type region 34 is in contact with or slightly overlaps facing p-type regions 34 in the depth direction and facing n-type regions 33 in the horizontal direction. In other words, the portion 4A of the p-type partition region 4 on the source-side is formed by the p-type regions 34, which have a substantially circular cross-sectional shape, being connected to an extent that the p-type regions 34 are in contact with or slightly overlap each other in the depth direction. Therefore, the impurity concentration profile of the portion 4A of the p-type partition region 4 on the source-side is substantially uniform in the depth direction.

On the other hand, each of the n-type regions 31 diffuses having a substantially circular cross-sectional shape having a center at a depth position of the range of the ion implantation 23 and diffuses so as to overlap the n-type regions 31 in the same n⁻-type epitaxial layer 21a and facing thereto in the depth direction. In other words, the n-type regions 31 overlap each other in the depth direction whereby the portion 3H of the n-type drift region 3 on the drain-side is formed having a substantially elliptical cross-sectional shape longer in the depth direction. Therefore, the portion 3H of the n-type drift region 3 on the drain-side has an impurity concentration profile that is a compound of the impurity concentration profiles of the n-type regions 31 and the impurity concentration $C_{n1}$ becomes higher than that of the portion 3A of the n-type drift region 3 on the source-side. The impurity concentration profile of a single n-type region 31 has an arch-shape with the depth position of the range of the ion implantation 23 as a vertex, and the impurity concentration decreasing on the source and drain sides. Therefore, although a compound of the impurity concentration profiles of the n-type regions 31 forms a ridge-shaped impurity concentration profile of multiple continuous impurity concentration profiles each having an arch-shape with the depth position of the range of the ion implantation 23 as a vertex, the difference of the impurity concentration of the position (vertex) of the maximum impurity concentration of the n-type regions 31 and that of the respective vertices is small and therefore, is equivalent to an impurity concentration profile uniform in the depth direction. Horizontal diffusion of the n-type regions 31 is about the same as that of the n-type regions 33, which have a substantially equal impurity implantation amount and therefore, the width of the portion 3H of the n-type drift region 3 on the drain-side is substantially the same as the width of the portion 3A of the n-type drift region 3 on the source-side.

Each of the p-type regions 32 diffuses having a substantially circular cross-sectional shape having a center at a depth position of the range of the ion implantation 25 and diffuses so as to overlap the p-type regions 32 in the same n⁻-type epitaxial layer 21a and facing thereto in the depth direction. In other words, the p-type regions 32 overlap each other in the depth direction whereby the portion 4H of the p-type partition region 4 on the drain-side is formed having a substantially elliptical cross-sectional shape longer in the depth direction. Therefore, the portion 4H of the p-type partition region 4 on the drain-side has an impurity concentration profile that is a compound of the impurity concentration profiles of the p-type regions 32 and the impurity concentration $C_{p1}$ becomes higher than that of the portion 4A of the p-type partition region 4 on the source-side. Additionally, in the n⁻-type epitaxial layer 21a, since the number of the p-type regions 32 facing each other in the depth direction is greater than the number of the n-type regions 31 facing each other in the depth direction, the impurity concentration $C_{p1}$ of the portion 4H of the p-type partition region 4 on the drain-side becomes higher than the impurity concentration $C_{n1}$ of the portion 3H of the n-type drift region 3 on the drain-side. Although a compound of the impurity concentration profiles of the p-type regions 32 forms a ridge-shaped impurity concentration profile similar to that of the n-type regions 31 described above, the difference of the impurity concentration of the position (vertex) of the maximum impurity concentration of the p-type regions 32 and that of the respective vertices is small and therefore, is equivalent to an impurity concentration profile uniform in the depth direction. Horizontal diffusion of the p-type regions 32 is about the same as that of the p-type regions 34 having a substantially equal impurity implantation amount and therefore, the width of the portion 4H of the p-type partition region 4 on the drain-side is substantially the same as the width of the portion 4A of the p-type partition region 4 on the source-side.

Further, by performing multiple sessions of the ion implantations 23, 25 in the n⁻-type epitaxial layer 21a of one step and forming the portion 3H of the n-type drift region 3 on the drain-side and the portion 4H of the p-type partition region 4 on the drain-side, as described above, the portions 3H, 4H may be formed to have a substantially elliptical cross-sectional shape longer in the depth direction. Therefore, compared to a case in which the portions 3H, 4H of the same impurity concentrations $C_{n1}$, $C_{p1}$ are formed by one session of ion implantation in the n⁻-type epitaxial layer 21a of one step, the widths of the n-type drift region 3 and the p-type partition region 4 do not increase, the thicknesses (the thickness T of the parallel pn layer 2b) of the n-type drift region 3 and the p-type partition region 4 may be physically increased. Accordingly, when the n⁻-type epitaxial layers 21a, 21b becoming the parallel pn layer 2b are to have the same number of steps, compared to a case in which one session of ion implantation is performed in the n⁻-type epitaxial layer 21a of one step, the breakdown voltage may be increased. Further, since the thickness of the n-type drift region 3 becomes physically thicker, the ON-state resistance may be reduced. Moreover, since the number of steps of the n⁻-type epitaxial layer needs not be increased, manufacturing cost may be reduced.

By the processes up to here, the parallel pn layer 2b is formed in which the n-type drift region 3 and the p-type partition region 4 are repeatedly arranged alternating in a direction parallel to the base main surface. Further, the semiconductor base (semiconductor wafer) 10 on which the parallel pn layer 2b is stacked is formed on the epitaxial substrate 20.

Next, by a general method, a MOS gate of a planar gate constituted by the p-type base region 5, the n⁺-type source region 6, the gate insulating film 7, and the gate electrode 8 is formed on the surface layer of the parallel pn layer 2b. Next, the interlayer insulating film 9 is formed so as to cover the gate electrode 8. The interlayer insulating film 9 and the gate insulating film 7 are patterned and a contact hole is formed, exposing the p-type base region 5 and the n⁺-type source region 6. Next, the source electrode 11 is formed so as to contact the p-type base region 5 and the n⁺-type source region 6. The drain electrode 12 is formed to be in contact with the rear surface of the semiconductor base 10 (rear surface of the n⁺-type semiconductor substrate 1). Thereafter, the semiconductor base 10 is diced (cut) into individual chips whereby the SJ-MOSFET depicted in FIG. 1A is completed.

As described above, according to the first embodiment, the impurity concentration of a portion of the p-type partition region on the drain-side is higher than the impurity concentration of a portion on the source-side and the impurity concentration of part of the portion on the source-side is reduced. In addition, the impurity concentration of a portion of the p-type partition region on the drain-side is higher than the impurity concentration of the portion of the n-type drift region on the drain-side. As a result, the electric field strength of the portion of the p-type partition region on the drain-side may be increased whereby the electric field strength of the portion of the n-type drift region on the drain-side may also be increased. Therefore, a higher voltage may be applied to the n-type drift region, enabling the breakdown voltage to be enhanced.

Further, according to the first embodiment, the impurity concentration of a portion of the n-type drift region on the drain-side is higher than the impurity concentration of a portion thereof on the source-side whereby the ON-state resistance may be reduced. Further, according to the first embodiment, the impurity concentration of a portion of the p-type partition region on the drain-side is higher than the impurity concentration of a portion thereof on the source-side whereby the parallel pn layer may be formed under a condition that avalanche breakdown occurs at the boundary of the p-type partition region and the n⁻-type buffer layer. Therefore, avalanche tolerance may be enhanced. Accordingly, the ON-state resistance may be lowered and the breakdown voltage as well as the avalanche tolerance may be enhanced.

Figure 9:
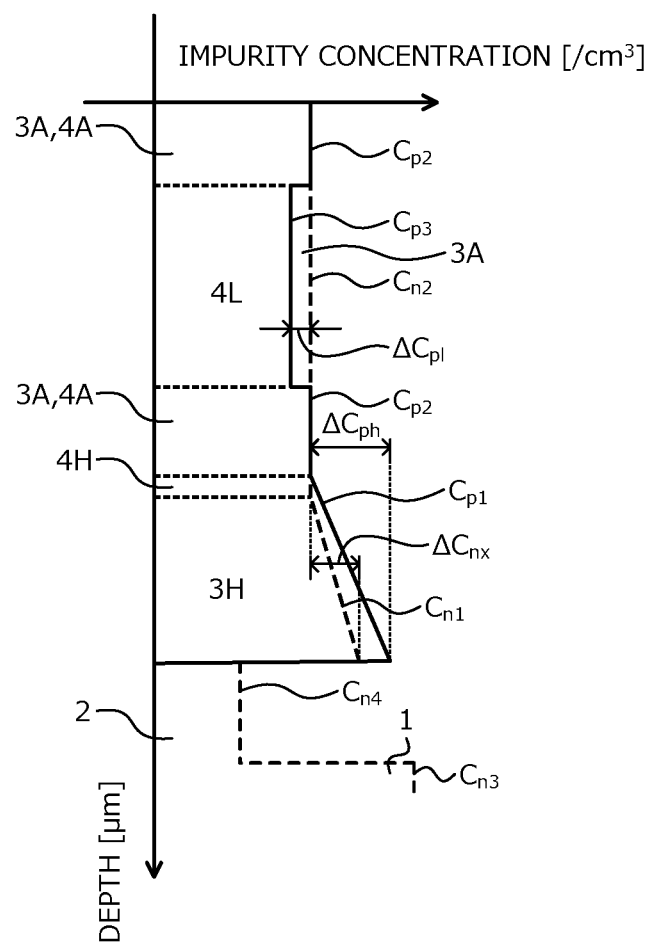
FIG. 9 is a characteristics diagram depicting impurity concentration profiles in a depth direction of constituent regions of the semiconductor device according to a second embodiment.

The semiconductor device according to a second embodiment will be described. FIG. 9 is a characteristics diagram depicting impurity concentration profiles in a depth direction of constituent regions of the semiconductor device according to the second embodiment. The structure of the semiconductor device according to the second embodiment is identical to that of the first embodiment (refer to FIG. 1A). FIG. 9 depicts the impurity concentration profiles in the depth direction of constituent regions of the semiconductor base 10 depicted in FIG. 1A. In the semiconductor device according to the second embodiment, the impurity concentration profiles of the portion 3H of the n-type drift region 3 on the drain-side and the portion 4H of the p-type partition region 4 on the drain-side differ from those of the semiconductor device according to the first embodiment.

In particular, as depicted in FIG. 9, the impurity concentration of the portion 3H of the n-type drift region 3 on the drain-side increases from the boundary with the portion 3A of the n-type drift region 3 on the source-side toward the drain-side according to a predetermined ratio (slope) and is highest at the boundary with the n⁻-type buffer layer 2a. The impurity concentration of the portion 4H of the p-type partition region 4 on the drain-side increases from the boundary with the portion 4A of the p-type partition region 4 on the source-side toward the drain-side according to a predetermined ratio and is highest at the boundary with the n⁻-type buffer layer 2a.

For example, in the portion 4H of the p-type partition region 4 on the drain-side, the impurity concentration at the boundary with the n⁻-type buffer layer 2a may be, for example, about 1.5 times the impurity concentration at the boundary with the portion 4A of the p-type partition region 4 on the source-side. Further, similar to the first embodiment, the impurity concentrations of the n-type drift region 3 and the p-type partition region 4 in the depth direction are set so that total impurity amount of the n-type impurity of the n-type drift region 3 and the total impurity amount of the p-type impurity of the p-type partition region 4 become roughly the same. In other words, the charge balance of the n-type drift region 3 and the p-type partition region 4 is maintained.

In other words, the impurity concentrations $C_{n1}$, $C_{n2}$ of the portions 3H, 3A of the n-type drift region 3 and of the impurity concentrations $C_{p1}$, $C_{p2}$, $C_{p3}$ of the portions 4H, 4A, 4L of the p-type partition region 4 satisfy equation (2).

$$C_{n2} \cdot t_{n1} + (C_{n2} + \tfrac{1}{2} \cdot \Delta C_{nx}) \cdot t_{n2} = C_{p2} \cdot t_{p1} + (C_{p2} - \Delta C_{p1}) \cdot t_{p2} + C_{p2} \cdot t_{p3} + (C_{p2} + \tfrac{1}{2} \cdot \Delta C_{ph}) \cdot t_{p4} \qquad (2)$$

The method of manufacturing a semiconductor device according to the second embodiment may be implemented by changing according to the impurity concentration profile of the portion 3H, the dose amounts of the multiple sessions of the ion implantation 23 (refer to FIG. 3) for forming the portion 3H of the n-type drift region 3 on the drain-side in the method of manufacturing a semiconductor device according to the first embodiment. In particular, in the multiple sessions of the ion implantation 23, the lower the accelerating voltage of the ion implantation 23 is, the lower the dose amount is set.

Further, the dose amounts of the multiple sessions of the ion implantation 25 (refer to FIG. 4) for forming the portion 4H of the p-type partition region 4 on the drain-side are changed according to the impurity concentration profile of the portion 4H. In particular, among the multiple sessions of the ion implantation 25, the lower the accelerating voltage of the ion implantation 25 is, the lower the dose amount is set.

The dose amount of the ion implantation 27 (refer to FIG. 6) for forming the portion 3A of the n-type drift region 3 on the source-side is substantially the same as the dose amount of the ion implantation 23 for which the accelerating voltage is lowest among the multiple sessions of the ion implantation 23. The impurity implantation amount range of the n-type region 31 with respect to the impurity implantation amount of the n-type region 33 formed by the ion implantation 27 is the same as that in the first embodiment.

The dose amount of the ion implantation 29 (refer to FIG. 7) for forming the portion 4A of the p-type partition region 4 on the source-side is substantially the same as the dose amount of the ion implantation 25 for which the accelerating voltage is lowest among the multiple sessions of the ion implantation 25. The impurity implantation amount range of the p-type region 32 with respect to the impurity implantation amount of the p-type region 34 formed by the ion implantation 29 is the same as that in the first embodiment.

Figure 10:
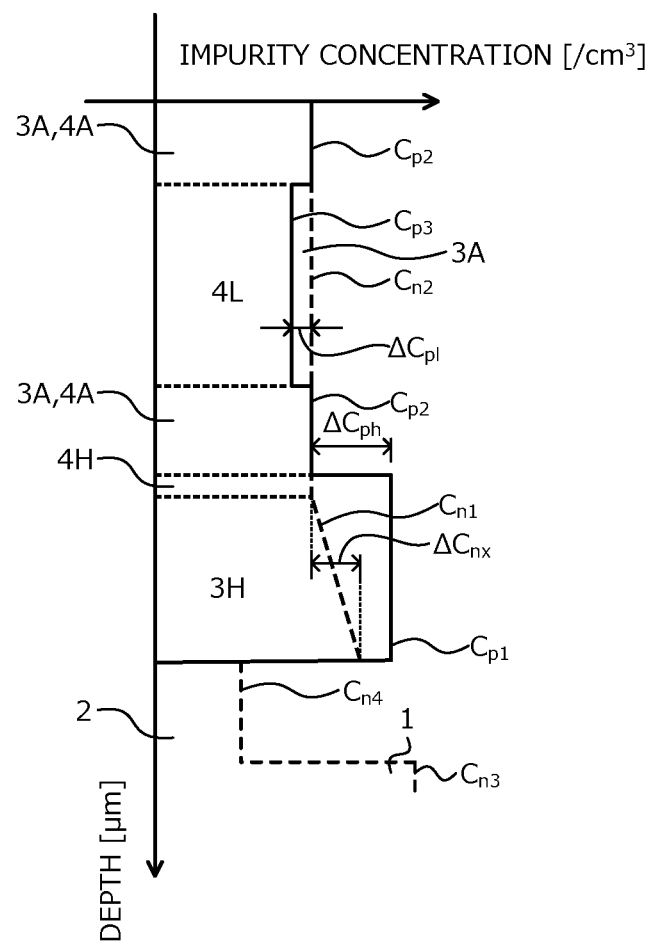
FIGS. 10 and 11 are characteristics diagrams of impurity concentration profiles in the depth direction of constituent regions of other examples of the semiconductor device according to the second embodiment.
Figure 11:
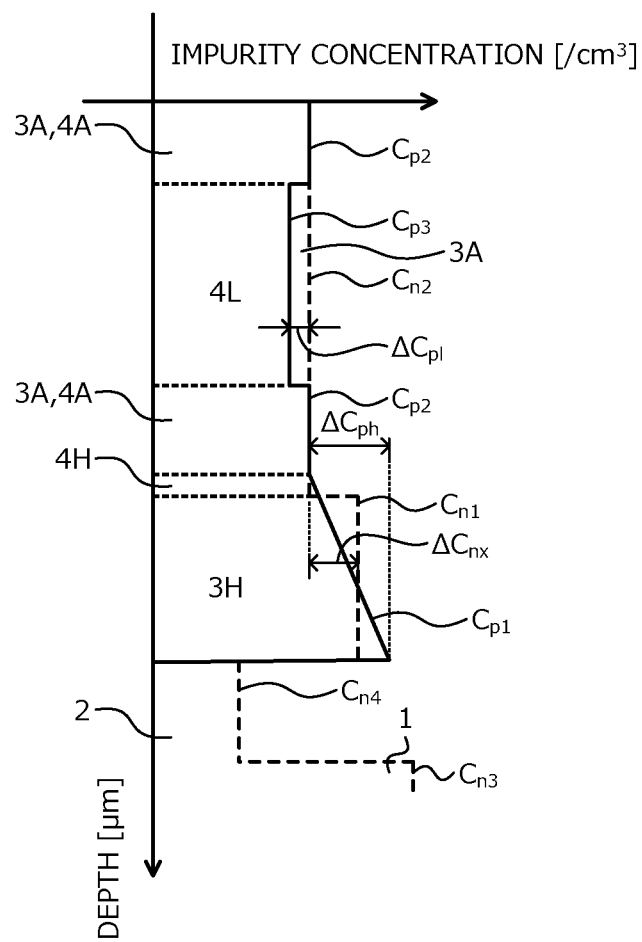

Another example of the semiconductor device according to the second embodiment will be described. FIGS. 10 and 11 are characteristics diagrams of impurity concentration profiles in the depth direction of constituent regions of other examples of the semiconductor device according to the second embodiment. In the semiconductor device according to the second embodiment and depicted in FIG. 9, the impurity concentration profile of either one of the portion 3H of the n-type drift region 3 on the drain-side and the portion 4H of the p-type partition region 4 on the drain-side may be changed.

In other words, as depicted in FIG. 10, configuration may be such that only the impurity concentration of the portion 3H of the n-type drift region 3 on the drain-side increases from the boundary with the portion 3A of the n-type drift region 3 on the source-side toward the drain-side according to a predetermined ratio. In this case, the impurity concentrations $C_{n1}$, $C_{n2}$ of the portions 3H, 3A of the n-type drift region 3 and the impurity concentrations $C_{p1}$, $C_{p2}$, $C_{p3}$ of the portion 4H, 4A, 4L of the p-type partition region 4 are set to satisfy equation (3).

$$C_{n2} \cdot t_{n1} + (C_{n2} + \tfrac{1}{2} \cdot \Delta C_{nx}) \cdot t_{n2} = C_{p2} \cdot t_{p1} + (C_{p2} - \Delta C_{pl}) \cdot t_{p2} + C_{p2} \cdot t_{p3} + (C_{p2} + \Delta C_{ph}) \cdot t_{p4} \qquad (3)$$

As depicted in FIG. 11, the impurity concentration of the portion 4H of the p-type partition region 4 on the drain-side may increase from the boundary with the portion 4A of the p-type partition region 4 on the source-side toward the drain-side according to a predetermined ratio. In this case, although the impurity concentration at the source-side of the portion 4H of the p-type partition region 4 on the drain-side becomes lower than the impurity concentration of the portion 3H of the n-type drift region 3 on the drain-side, the impurity concentrations $C_{n1}$, $C_{n2}$ of the portions 3H, 3A of the n-type drift region 3 and the impurity concentrations $C_{p1}$, $C_{p2}$, $C_{p3}$ of the portions 4H, 4A, 4L of the p-type partition region 4 are set to satisfy equation (4).

$$C_{n2} \cdot t_{n1} + (C_{n2} + \Delta C_{nx}) \cdot t_{n2} = C_{p2} \cdot t_{p1} + (C_{p2} - \Delta C_{pl}) \cdot t_{p2} + C_{p2} \cdot t_{p3} + (C_{p2} + \tfrac{1}{2} \cdot \Delta C_{ph}) \cdot t_{p4} \qquad (4)$$

As described above, according to the second embodiment, effects identical to those of the first embodiment may be obtained. Further, according to the second embodiment, the impurity concentration of a portion of the n-type drift region or the p-type partition region, or both, on the drain-side increases toward the drain-side according to a predetermined ratio whereby the widths of the n-type drift region and the p-type partition region may be made to be constant in the depth direction.

The semiconductor device according to a third embodiment will be described. FIGS. 12A and 12B are diagrams of constituent regions of the semiconductor device according to the third embodiment. The structure of the semiconductor device according to the third embodiment is the same as that of the first embodiment (refer to FIG. 1A). FIG. 12A depicts impurity concentration profiles in the depth direction of constituent regions of the semiconductor base 10 in FIG. 1A. FIG. 12B depicts electric field strength distribution $L_{11}$ for the impurity concentration profile in FIG. 12A. In the semiconductor device according to the third embodiment, the impurity concentration profile of the portion 4L having the impurity concentration $C_{p3}$ that is lowest of the p-type partition region 4 differs from that of the semiconductor device according to the first embodiment.

In particular, as depicted in FIG. 12A, the impurity concentration of the portion 4L having the impurity concentration $C_{p3}$ that is lowest of the p-type partition region 4 decreases from the source-side toward the drain-side according to a predetermined ratio (slope) and is lowest near a center of the portion 4L in the depth direction. Additionally, the impurity concentration of the portion 4L having the impurity concentration $C_{p3}$ that is lowest of the p-type partition region 4 increases from near a center of the portion 4L in the depth direction according to a predetermined ratio. In this case, the impurity concentrations $C_{n1}$, $C_{n2}$ of the portions 3H, 3A of the n-type drift region 3 and the impurity concentrations $C_{p1}$, $C_{p2}$, $C_{p3}$ of the portions 4H, 4A, 4L of the p-type partition region 4 are set to satisfy equation (5).

$$C_{n2} \cdot t_{n1} + (C_{n2} + \Delta C_{nx}) \cdot t_{n2} = C_{p2} \cdot t_{p1} + (C_{p2} - \tfrac{1}{2} \cdot \Delta C_{pl}) \cdot t_{p2} + C_{p2} \cdot t_{p3} + (C_{p2} + \Delta C_{ph}) \cdot t_{p4} \qquad (5)$$

As indicated by a solid line in FIG. 12B, although the voltage (breakdown voltage) that may be applied to the parallel pn layer 2b becomes lowest near a center in the depth direction of the portion 4L having the impurity concentration $C_{p3}$ that is lowest of the p-type partition region 4, similar to the first embodiment, the decreased breakdown voltage at the portion 4L is compensated by the increased breakdown voltage at the portion 4H of the p-type partition region 4 on the drain-side.

The method of manufacturing a semiconductor device according to the third embodiment may be implemented by changing according to the impurity concentration profile of the portion 4L, the dose amount of the ion implantation 29 for forming the portion 4L having the impurity concentration $C_{p3}$ that is lowest of the p-type partition region 4, in the sessions of the ion implantation 29 (refer to FIG. 7) performed each time the n⁻-type epitaxial layer 21b is formed by epitaxial growth in the method of manufacturing a semiconductor device according to the first embodiment. Here, the stacked layer steps (stacked layer count) of the n⁻-type epitaxial layer 21b for forming the portion 4L having the impurity concentration $C_{p3}$ that is lowest of the p-type partition region 4 is assumed to be, for example, an odd number of steps of three or more. Among the n⁻-type epitaxial layers 21b of an odd number of steps, the dose amount of the ion implantation 29 for the n⁻-type epitaxial layer 21b stacked at a center is set to be the lowest.

In particular, each time the n⁻-type epitaxial layer 21b is formed by epitaxial growth, the dose amount of the ion implantation 29 for forming the portion 4L having the impurity concentration $C_{p3}$ that is lowest of the p-type partition region 4 is lowered. With a position near a center in the depth direction of the portion 4L having the impurity concentration $C_{p3}$ that is lowest of the p-type partition region 4 as a boundary, each time the n⁻-type epitaxial layer 21b is formed by epitaxial growth, the dose amount of the ion implantation 29 is increased. Among the p-type regions 34 formed by the ion implantation 29, the impurity implantation amount range of the other p-type regions 34 with respect to the impurity implantation amount of the p-type regions 34 becoming the portion 4L having the impurity concentration $C_{p3}$ that is lowest of the p-type partition region 4 is the same as that in the first embodiment.

As described above, according to the third embodiment, even when the impurity concentration profile of a portion having the lowest impurity concentration of the p-type partition region is changed, effects identical to those of the first and second embodiments may be obtained.

Figure 13:
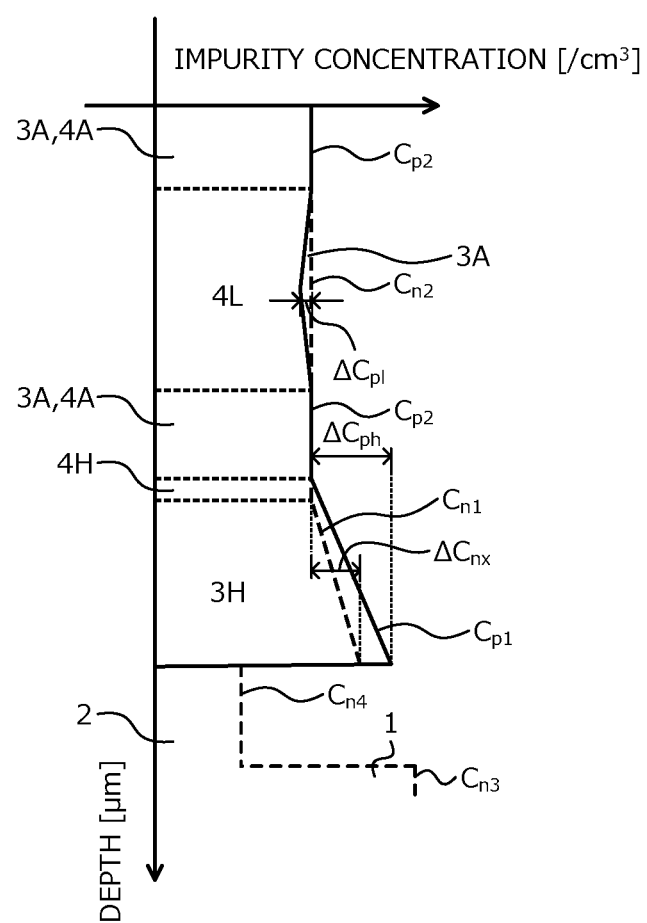
FIG. 13 is a characteristics diagram of impurity concentration profiles of constituent regions of the semiconductor device according to a fourth embodiment.

The semiconductor device according to a fourth embodiment will be described. FIG. 13 is a characteristics diagram of impurity concentration profiles of constituent regions of the semiconductor device according to the fourth embodiment. The structure of the semiconductor device according to the fourth embodiment is identical to that of the first embodiment (refer to FIG. 1A). FIG. 13 depicts the impurity concentration profiles in the depth direction of the constituent regions of the semiconductor base 10 depicted in FIG. 1A. The semiconductor device according to the fourth embodiment is a SJ-MOSFET obtained by applying the third embodiment to the second embodiment.

In other words, as depicted in FIG. 13, similar to the second embodiment (refer to FIG. 9), the impurity concentrations of the portion 3H of the n-type drift region 3 on the drain-side and the portion 4H of the p-type partition region 4 on the drain-side increase toward the drain-side according to a predetermined ratio. In addition, similar to the third embodiment (refer to FIG. 12A), the impurity concentration of the portion 4L having the impurity concentration $C_{p3}$ that is lowest of the p-type partition region 4 is lowest near a center of the portion 4L in the depth direction. The impurity concentrations $C_{n1}$, $C_{n2}$ of the portions 3H, 3A of the n-type drift region 3 and the impurity concentrations $C_{p1}$, $C_{p2}$, $C_{p3}$ of the portions 4H, 4A, 4L of the p-type partition region 4 satisfy equation (6).

$$C_{n2} \cdot t_{n1} + (C_{n2} + \tfrac{1}{2} \cdot \Delta C_{nx}) \cdot t_{n2} = C_{p2} \cdot t_{p1} + (C_{p2} - \tfrac{1}{2} \cdot \Delta C_{pl}) \cdot t_{p2} + C_{p2} \cdot t_{p3} + (C_{p2} + \tfrac{1}{2} \Delta C_{ph}) \cdot t_{p4} \quad (6)$$

Figure 14:
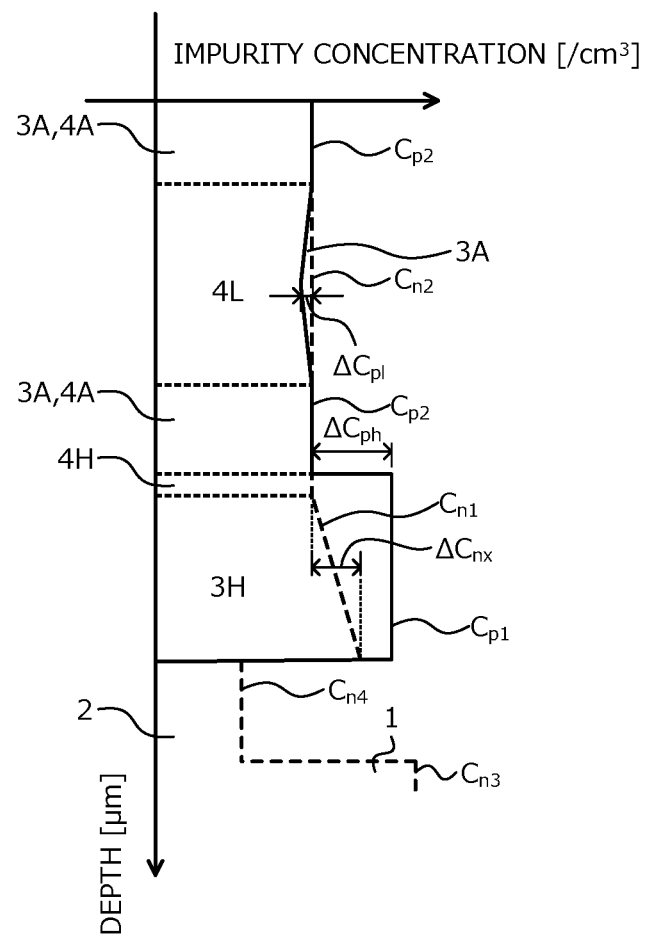
FIGS. 14 and 15 are characteristics diagrams of impurity concentration profiles in the depth direction of constituent regions of other examples of the semiconductor device according to the fourth embodiment.
Figure 15:
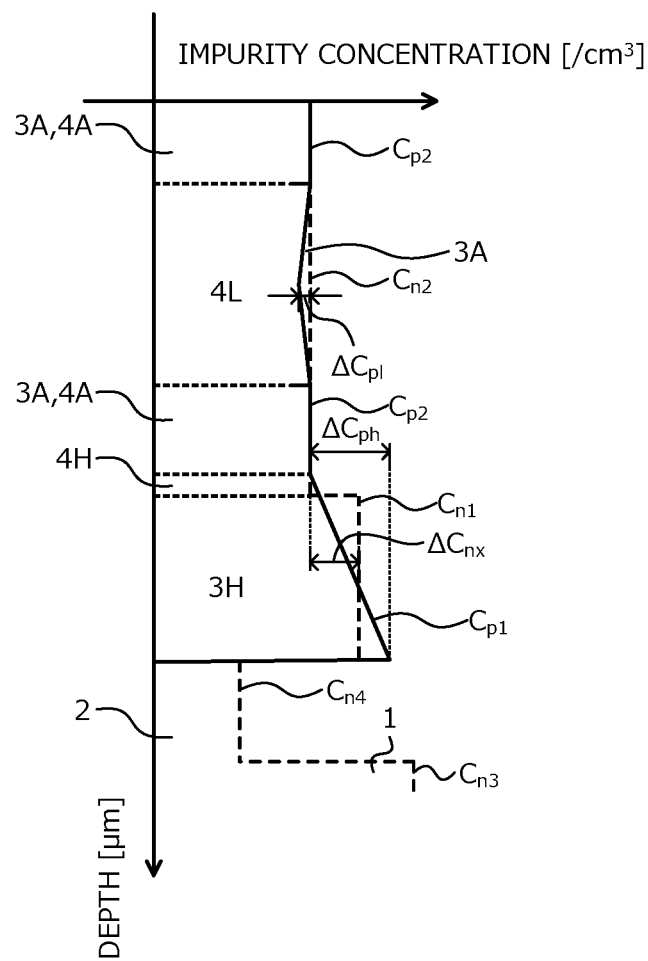

FIGS. 14 and 15 are characteristics diagrams of impurity concentration profiles in the depth direction of constituent regions of other examples of the semiconductor device according to the fourth embodiment. Similar to the modification examples of the second embodiment (FIGS. 10 and 11), the impurity concentration profile of either one of the portion 3H of the n-type drift region 3 on the drain-side and the portion 4H of the p-type partition region 4 on the drain-side may be changed. FIG. 14 depicts a case in which only the impurity concentration profile of the portion 3H of the n-type drift region 3 on the drain-side is changed. FIG. 15 depicts a case in which only the impurity concentration profile of the portion 4H of the p-type partition region 4 on the drain-side is changed.

As described above, according to the fourth embodiment, effects identical to those of the first to third embodiments may be obtained.

Figure 16:
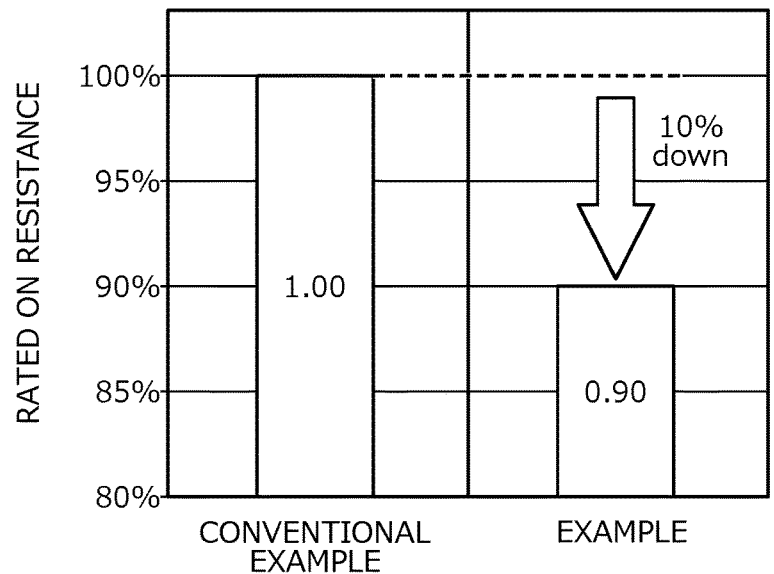
FIG. 16 is a characteristics diagram of ON-state resistance of a semiconductor device according to an example.
Figure 17:
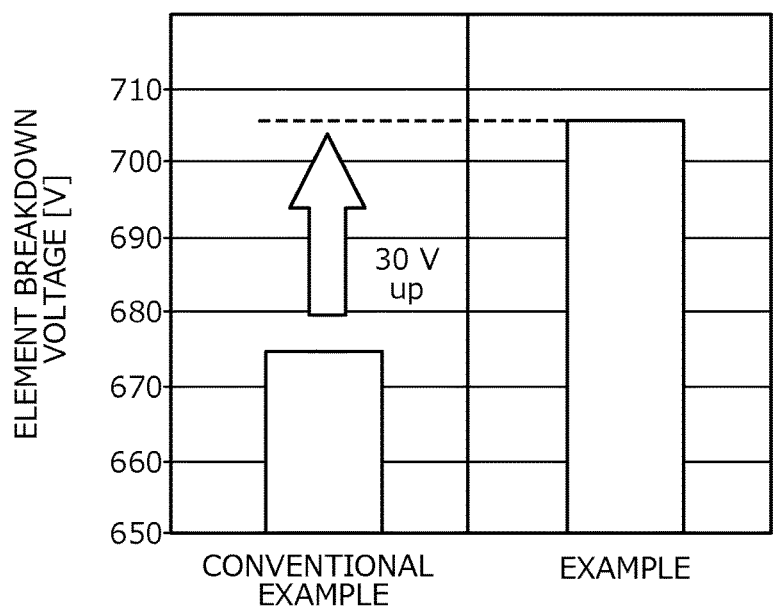
FIG. 17 is a characteristics diagram of breakdown voltage of the semiconductor device according to the example.

The relationship of the ON-state resistance and breakdown voltage was verified. FIG. 16 is a characteristics diagram of the ON-state resistance of a semiconductor device according to an example. FIG. 17 is a characteristics diagram of breakdown voltage of the semiconductor device according to the example. Measurement results of the ON-state resistance and breakdown voltage of a SJ-MOSFET (hereinafter, EXAMPLE) having the impurity concentration profile of the semiconductor device according to the first embodiment described above are depicted in FIGS. 16 and 17, respectively.

Dimensions and impurity concentrations of regions of EXAMPLE are as follows. The thickness T of the parallel pn layer 2b is 40 μm and the widths of the n-type drift region 3 and the p-type partition region 4 are 6 μm (repeat pitch: 12 μm). The impurity concentration $C_{n1}$ of the portion 3H of the n-type drift region 3 on the drain-side is $6.8 \times 10^{16}/cm^3$. The impurity concentration $C_{n2}$ of the portion 3A of the n-type drift region 3 on the source-side is $6.6 \times 10^{16}/cm^3$.

The impurity concentration $C_{p1}$ of the portion 4H of the p-type partition region 4 on the drain-side is $7.3 \times 10^{16}/cm^3$. The impurity concentration $C_{p2}$ of the portion 4A of the p-type partition region 4 on the source-side is $6.5 \times 10^{16}/cm^3$. The impurity concentration $C_{p3}$ of the portion 4L having the impurity concentration $C_{p3}$ that is lowest of the p-type partition region 4 is $6.0 \times 10^{16}/cm^3$. The thickness and the impurity concentration $C_{n4}$ of the n⁻-type buffer layer 2a are 6.5 μm and $9.8 \times 10^{14}/cm^3$, respectively.

Further, FIGS. 16 and 17 depict the ON-state resistance and breakdown voltage of a conventional example, respectively. The conventional example is a SJ-MOSFET in which the total impurity amounts of the n-type drift region and the p-type partition region of the parallel pn layer are roughly the same and impurity concentrations in the depth direction of the respective regions are roughly uniform. In FIG. 16, EXAMPLE and the conventional example are configured to have the same breakdown voltage (700V) and the ON-state resistance of EXAMPLE when the ON-state resistance of the conventional example is 100% is standardized. FIG. 17 depicts the breakdown voltage of EXAMPLE and the conventional example when EXAMPLE and the conventional example are configured to have the same ON-state resistance.

From the results depicted in FIG. 16, in EXAMPLE, the ON-state resistance is confirmed to be reduced about 10% compared to the conventional example. From the result depicted in FIG. 17, in EXAMPLE, the breakdown voltage is confirmed to be enhanced by 30V compared to the conventional example. Although not depicted, results similar to EXAMPLE were obtained for the semiconductor device according to the second to fifth embodiments.

The present invention is not limited to the described embodiments and various modifications are possible within a scope not departing from the spirit of the present invention. For example, in the parallel pn layer of the active region and in the parallel pn layer of the edge termination region, the widths and the planar layouts of the n-type drift region and the p-type partition region may differ. The n-type drift region alone may be provided without providing the parallel pn layer in the edge termination region. Further, in place of the MOS gate of a planar gate, a MOS gate of a trench gate structure may be provided.

In each of the embodiments described, although the parallel pn layer is formed by repeatedly performing a set of processes including epitaxial growth and ion implantation, provided the above impurity concentration profile of the parallel pn layer is obtained, for example, an epitaxial layer may be embedded in a trench to form the parallel pn layer. Further, each of the embodiments described, although silicon is used as a semiconductor material, a semiconductor having a wider bandgap such as silicon carbide (SiC), gallium nitride (GaN), or the like may be used.

In each of the embodiments described, although description is given taking a MOSFET as an example, provided the semiconductor device includes a SJ structure, front surface element structures may be various changed. For example, the present invention is further applicable to Schottky barrier diodes (SBDs), semiconductor devices having a SBD and a MOSFET on a single semiconductor base, and insulated gate bipolar transistors (IGBTs). When the present invention is applied to an IGBT, in place of the $n^+$-type semiconductor substrate, a $p^+$-type semiconductor substrate forming a $p^+$-type collector layer may be used, or a semiconductor substrate having a lower n-type impurity concentration that an $n^+$-type semiconductor substrate may be used and from the rear surface of the semiconductor substrate, a p-type impurity may be implanted, forming the $p^+$-type collector layer. Further, the present invention is similarly implemented when the conductivity types (n-type, p-type) are reversed.

However, in Japanese Laid-Open Patent Publication No. 2004-072068, a portion having high electric field has an electric field strength distribution distributed along the pn junction between the p-type partition region and the n-type drift region. Further, the p-type base region and the $n^+$-type source region are arranged directly above the p-type partition region (substrate front surface side) whereby avalanche current passes directly beneath the $n^+$-type source region (a portion of the p-type base region between the $n^+$-type source region and the p-type partition region of a parallel pn layer) and flows to the source electrode. Therefore, the avalanche current becomes base current of a parasitic npn bipolar transistor in which the $n^+$-type source region acts as an emitter, the p-type base region acts as a base, and the surface region (region on the substrate front surface side) of the n-type drift region acts as a collector whereby the parasitic npn bipolar transistor operates, arising in a problem of destruction.

In Japanese Patent No. 4564509, at a center in the depth direction of the n-type drift region and the p-type partition region, the p-type and n-type impurity concentrations are both high and consequently, the electric field peaks at central portion in the depth direction. Therefore, when avalanche breakdown near the gate electrode occurs, the distance of the site of avalanche breakdown and the site of electric field concentration in the depth direction becomes close, gate potential varies through the gate oxide film, feedback current to the gate flows, and avalanche tolerance may be adversely affected (for example, refer to S. C. Lee, et al, "Investigation of Gate Oscillation of Power MOSFETs Induced by Avalanche Mode Operation", Proceedings of the 19th International Symposium on Power Semiconductor Devices and IC's, Korea, IEEE, May 2007, pp. 113 to 116).

In Japanese Patent No. 4768259, Japanese Laid-Open Patent Publication No. 2009-272397, and Japanese Laid-Open Patent Publication No. 2006-179598, only the impurity concentration on the substrate rear surface side of the p-type partition region is locally increased and the balance of the impurity concentrations of the n-type drift region and the p-type partition region is forcibly lost. Although the electric field on the substrate front surface side decreases by the difference of the impurity concentrations of the n-type drift region and the p-type partition region, this decrease of the electric field is canceled out by the electric field increase occurring consequent to locally increasing the impurity concentration on the substrate rear surface side of the p-type partition region and the effect of changing the electric field strength distribution in the depth direction diminishes. To sufficiently change the electric field strength distribution and cause the electric field to concentrate at a portion on the substrate rear surface side of the p-type partition region, the difference of impurity concentrations the n-type drift region and the p-type partition region has to be increased. As a result, the impurity concentration of the p-type partition region increases and the n-type drift region is easily depleted whereby the ON-state resistance increases.

According to the invention above, the ON-state resistance may be reduced and the electric field strength of a portion on a second electrode side of first- and second-conductivity-type semiconductor regions may be increased. Further, according to the present invention, avalanche breakdown may be cause to occur at the boundary of the second-conductivity-type semiconductor region and the first-conductivity-type low-concentration semiconductor layer.

According to the semiconductor device and the method of manufacturing a semiconductor device of the present invention, an effect is achieved in that the ON-state resistance may be reduced and breakdown voltage as well as avalanche tolerance may be enhanced.

Thus, the semiconductor device and the method of manufacturing a semiconductor device of the present invention is useful for semiconductor devices having a SJ structure.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device comprising:
   a parallel pn layer in which a first-conductivity-type semiconductor region and a second-conductivity-type semiconductor region are alternately arranged on a semiconductor layer of a first conductivity type, repeatedly along a direction parallel to a surface of the semiconductor layer;

an element structure provided on a side of the parallel pn layer opposite the semiconductor layer;
a first electrode electrically connected to a semiconductor area constituting the element structure; and
a second electrode electrically connected to the semiconductor layer, wherein
the first-conductivity-type semiconductor region has a width that is constant in a depth direction,
the second-conductivity-type semiconductor region has a width that is constant in the depth direction,
the first-conductivity-type semiconductor region has an impurity concentration profile in which an impurity concentration of a portion of the first-conductivity-type semiconductor region toward the second electrode is made higher than an impurity concentration of a portion of the first-conductivity-type semiconductor region toward the first electrode,
the second-conductivity-type semiconductor region has an impurity concentration profile in which an impurity concentration of a portion of the second-conductivity-type semiconductor region toward the second electrode is made higher than an impurity concentration of a portion of the second-conductivity-type semiconductor region toward the first electrode, and an impurity concentration of part of the portion of the second-conductivity-type semiconductor region toward the first electrode is made lower than that of other parts of the portion of the second-conductivity-type semiconductor region toward the first electrode, and
the impurity concentration of the portion of the second-conductivity-type semiconductor region toward the second electrode is made higher than the impurity concentration of the portion of the first-conductivity-type semiconductor region toward the second electrode.

2. The semiconductor device according to claim 1, wherein
the first-conductivity-type semiconductor region and the second-conductivity-type semiconductor region have a same total impurity amount.

3. The semiconductor device according to claim 1, wherein
the impurity concentration of the portion of the second-conductivity-type semiconductor region toward the first electrode is a same impurity concentration as the impurity concentration of the portion of first-conductivity-type semiconductor region toward the first electrode.

4. The semiconductor device according to claim 1, wherein
the impurity concentration of the portion of the first-conductivity-type semiconductor region toward the second electrode increases toward the second electrode according to a predetermined ratio.

5. The semiconductor device according to claim 1, wherein
the impurity concentration of the portion of the second-conductivity-type semiconductor region toward the second electrode increases toward the second electrode according to a predetermined ratio.

6. The semiconductor device according to claim 1, wherein
a low-concentration portion of the portion of the second-conductivity-type semiconductor region toward the first electrode has an impurity concentration that is lowest near a center in a depth direction of the low-concentration portion.

7. The semiconductor device according to claim 1, wherein
the element structure includes:
a first semiconductor region of a second conductivity and constituting a portion of the semiconductor area, the first semiconductor region being formed in a surface layer on a side of the second-conductivity-type semiconductor region opposite the semiconductor layer, so as to be in contact with the first-conductivity-type semiconductor region;
a second semiconductor region of the first conductivity type and constituting another portion of the semiconductor area, the second semiconductor region being selectively formed in the first semiconductor region;
a gate insulating film formed so as to be in contact with a region of the first semiconductor region between the first-conductivity-type semiconductor region and the second semiconductor region; and
a gate electrode formed on an opposite side of the first semiconductor region, sandwiching the gate insulating film in between the gate electrode and the first semiconductor region.

8. The semiconductor device according to claim 1, comprising
a first-conductivity-type low-concentration semiconductor layer having an impurity concentration lower than an impurity concentration of the first-conductivity-type semiconductor region, formed between the semiconductor layer and the parallel pn layer.

* * * * *